United States Patent
Yang et al.

(10) Patent No.: US 10,797,039 B2
(45) Date of Patent: Oct. 6, 2020

(54) SEMICONDUCTOR DEVICE AND METHOD OF FORMING A 3D INTERPOSER SYSTEM-IN-PACKAGE MODULE

(71) Applicant: STATS ChipPAC Pte. Ltd., Singapore (SG)

(72) Inventors: DeokKyung Yang, Incheon Si (KR); OhHan Kim, In-cheon (KR); HeeSoo Lee, Kyunggi-do (KR); HunTeak Lee, Gyeongi-do (KR); InSang Yoon, Seoul (KR); Il Kwon Shim, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 15/976,455

(22) Filed: May 10, 2018

(65) Prior Publication Data

US 2018/0261569 A1    Sep. 13, 2018

Related U.S. Application Data

(63) Continuation-in-part of application No. 15/830,644, filed on Dec. 4, 2017, now Pat. No. 10,388,637.
(Continued)

(51) Int. Cl.
*H01L 25/00* (2006.01)
*H01L 23/00* (2006.01)
(Continued)

(52) U.S. Cl.
CPC .............. *H01L 25/50* (2013.01); *H01L 21/56* (2013.01); *H01L 21/561* (2013.01); *H01L 23/552* (2013.01); *H01L 24/17* (2013.01); *H01L 24/83* (2013.01); *H01L 25/0652* (2013.01); *H01L 25/16* (2013.01); *H01L 23/3128* (2013.01);
(Continued)

(58) Field of Classification Search
CPC ........... H01L 2924/15151; H01L 21/56; H01L 21/561; H01L 23/3128; H01L 25/0652; H01L 25/16; H01L 25/50; H01L 23/5385; H01L 24/97; H01L 2224/97; H01L 2924/15311; H01L 2924/19105; H01L 2924/19106
See application file for complete search history.

(56) References Cited

U.S. PATENT DOCUMENTS 3,943,623 A * 3/1976 Mizutani ............... H01L 23/057
29/854
5,536,972 A    7/1996 Kato
(Continued)

*Primary Examiner* — Scott B Geyer
(74) *Attorney, Agent, or Firm* — Brian M. Kaufman; Robert D. Atkins; Patent Law Group: Atkins and Associates, P.C.

(57) ABSTRACT

A semiconductor device has a first substrate and a second substrate. An opening is formed through the second substrate. A first semiconductor component and second semiconductor component are disposed between the first substrate and second substrate. The second substrate is electrically coupled to the first substrate through the first semiconductor component. A first terminal of the first semiconductor component is electrically coupled to the first substrate. A second terminal of the first semiconductor component is electrically coupled to the second substrate. The second semiconductor component extends into the opening. An encapsulant is deposited over the first substrate and second substrate.

21 Claims, 19 Drawing Sheets

US 10,797,039 B2
Page 2

Related U.S. Application Data

(60) Provisional application No. 62/431,219, filed on Dec. 7, 2016.

(51) Int. Cl.
*H01L 21/56* (2006.01)
*H01L 23/552* (2006.01)
*H01L 25/065* (2006.01)
*H01L 25/16* (2006.01)
H01L 23/498 (2006.01)
H01L 23/31 (2006.01)
H01L 23/538 (2006.01)
H01L 23/50 (2006.01)

(52) U.S. Cl.
CPC ........ *H01L 23/49816* (2013.01); *H01L 23/50* (2013.01); *H01L 23/5385* (2013.01); *H01L 24/16* (2013.01); *H01L 24/81* (2013.01); *H01L 24/97* (2013.01); *H01L 2224/0401* (2013.01); *H01L 2224/05111* (2013.01); *H01L 2224/05124* (2013.01); *H01L 2224/05139* (2013.01); *H01L 2224/05144* (2013.01); *H01L 2224/05147* (2013.01); *H01L 2224/05155* (2013.01); *H01L 2224/1146* (2013.01); *H01L 2224/11334* (2013.01); *H01L 2224/13023* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/16235* (2013.01); *H01L 2224/16237* (2013.01); *H01L 2224/16238* (2013.01); *H01L 2224/48091* (2013.01); *H01L 2224/48179* (2013.01); *H01L 2224/73265* (2013.01); *H01L 2224/81815* (2013.01); *H01L 2224/97* (2013.01); *H01L 2924/15151* (2013.01); *H01L 2924/15311* (2013.01); *H01L 2924/19105* (2013.01); *H01L 2924/19106* (2013.01); *H01L 2924/3025* (2013.01)

(56) References Cited

U.S. PATENT DOCUMENTS

| | | | |
|---|---|---|---|
| 6,418,029 B1 | 7/2002 | McKee et al. | |
| 6,618,267 B1 * | 9/2003 | Dalal | H01L 23/5385 257/E23.114 |
| 6,768,208 B2 * | 7/2004 | Lin | H01L 25/0657 257/673 |
| 6,989,589 B2 * | 1/2006 | Hammadou | H01L 27/11803 257/258 |
| 7,359,213 B2 * | 4/2008 | Vasudivan | H05K 1/0231 174/262 |
| 7,605,459 B2 | 10/2009 | Mok et al. | |
| 7,989,707 B2 | 8/2011 | Yamano et al. | |
| 8,026,129 B2 | 9/2011 | Cablao et al. | |
| 8,247,893 B2 | 8/2012 | Kim et al. | |
| 8,513,801 B2 * | 8/2013 | Tay | H01L 23/13 257/723 |
| 8,541,872 B2 | 9/2013 | Cho et al. | |
| 8,558,377 B2 | 10/2013 | Yoo | |
| 8,593,825 B2 | 11/2013 | Chen | |
| 8,618,671 B2 | 12/2013 | Kwon et al. | |
| 8,717,774 B2 | 5/2014 | Randall et al. | |
| 9,029,962 B1 * | 5/2015 | Dreiza | B81C 1/00301 257/416 |
| 9,553,079 B1 * | 1/2017 | Audet | H01L 25/16 |
| 2002/0036345 A1 * | 3/2002 | Iseki | H01L 21/563 257/734 |
| 2005/0098868 A1 | 5/2005 | Chang et al. | |
| 2006/0245308 A1 * | 11/2006 | Macropoulos | H05K 1/024 369/1 |
| 2006/0267175 A1 | 11/2006 | Lee | |
| 2007/0187810 A1 * | 8/2007 | Mok | H01L 23/13 257/686 |
| 2007/0216008 A1 | 9/2007 | Gerber | |
| 2007/0290319 A1 | 12/2007 | Kim | |
| 2008/0073742 A1 * | 3/2008 | Adkisson | H01L 27/14618 257/443 |
| 2008/0111224 A1 | 5/2008 | Byun et al. | |
| 2009/0020885 A1 * | 1/2009 | Onodera | H01L 23/13 257/777 |
| 2009/0179319 A1 | 7/2009 | Lee | |
| 2009/0212401 A1 | 8/2009 | Do et al. | |
| 2010/0244208 A1 * | 9/2010 | Pagaila | H01L 21/568 257/659 |
| 2011/0084380 A1 * | 4/2011 | Kwon | H01L 23/13 257/724 |
| 2012/0075807 A1 * | 3/2012 | Refai-Ahmed | H01L 25/0652 361/719 |
| 2012/0292745 A1 * | 11/2012 | Park | H01L 23/3128 257/621 |
| 2013/0249065 A1 | 9/2013 | Do et al. | |
| 2015/0115467 A1 * | 4/2015 | Park | H01L 23/3128 257/774 |
| 2015/0348928 A1 * | 12/2015 | Co | H01L 24/17 257/712 |
| 2016/0300797 A1 | 10/2016 | Shim et al. | |
| 2016/0343651 A1 | 11/2016 | Rae et al. | |
| 2016/0358848 A1 | 12/2016 | Meyer et al. | |
| 2018/0061809 A1 | 3/2018 | Chiu | |
| 2019/0189599 A1 * | 6/2019 | Baloglu | H01L 23/3736 |

\* cited by examiner

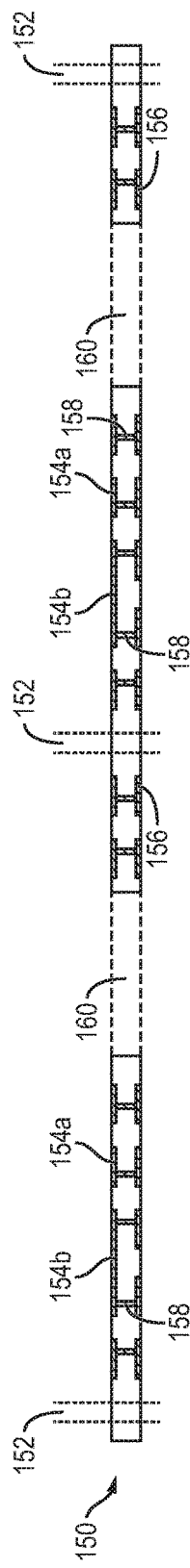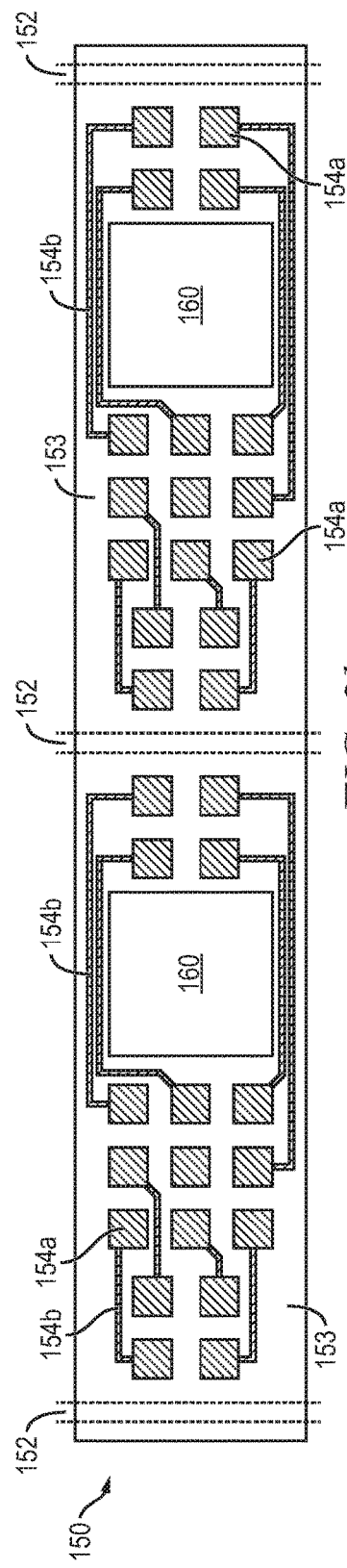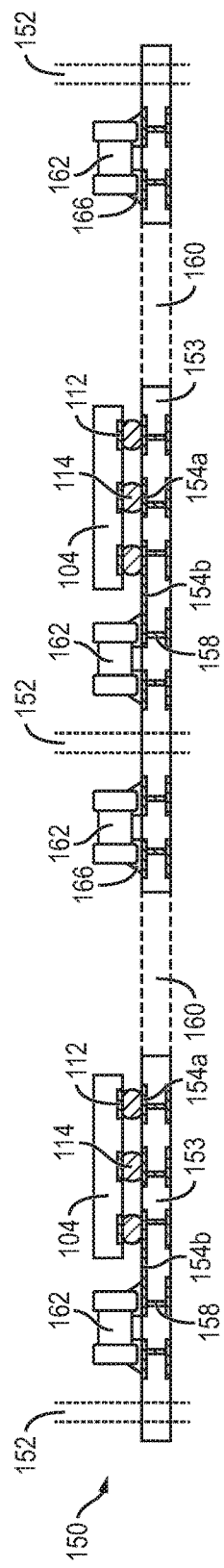

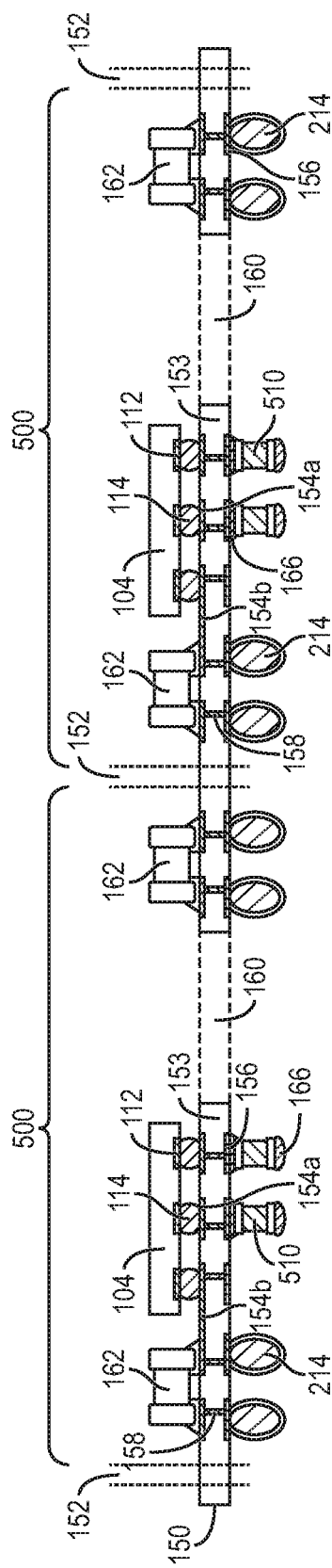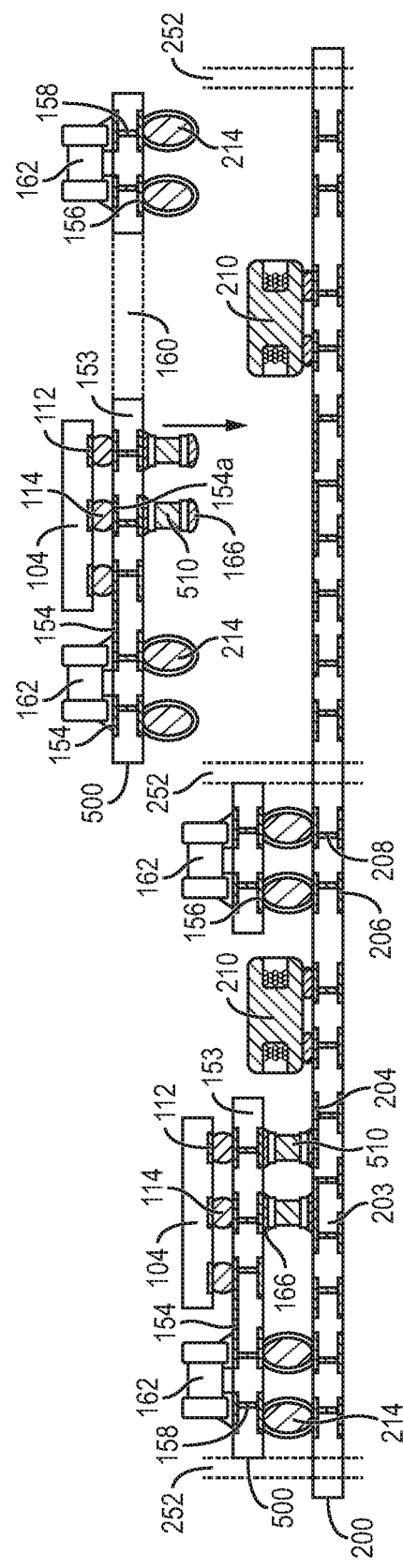

SEMICONDUCTOR DEVICE AND METHOD OF FORMING A 3D INTERPOSER SYSTEM-IN-PACKAGE MODULE

CLAIM OF DOMESTIC PRIORITY

The present application is a continuation-in-part of U.S. patent application Ser. No. 15/830,644, filed Dec. 4, 2017, which claims the benefit of U.S. Provisional Application No. 62/431,219, filed Dec. 7, 2016, which applications are incorporated herein by reference.

FIELD OF THE INVENTION

The present invention relates in general to semiconductor devices and, more particularly, to a semiconductor device and method of forming 3D interposer system-in-package (SiP) modules.

BACKGROUND OF THE INVENTION

Semiconductor devices are commonly found in modern electronic products. Semiconductor devices perform a wide range of functions such as signal processing, high-speed calculations, transmitting and receiving electromagnetic signals, controlling electronic devices, photoelectric generation, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor packages may be made with several active semiconductor components, discrete passive components, and integrated passive devices (IPDs) packaged together into a single-package system, sometimes known as a system-in-package (SiP) module. SiP modules offer higher density and enhanced electrical functionality relative to traditional semiconductor packaging.

The active and passive components of a SiP module are mounted to a substrate for structural support and electrical interconnect. The substrate and components are encapsulated for environmental protection. The encapsulant at the top surface of the package is generally planarized to make a block shaped package. Because the top surface is flat across the devices, the encapsulant surface must be at least as high as the tallest component within the SiP module. When taller components are used, more encapsulant is required across the entire device, even over shorter components. Encapsulant is wasted over shorter components, and semiconductor devices are made physically larger than necessary. Therefore, a need exists for SiP modules, and methods of forming, taking advantage of unused package space over shorter components.

BRIEF DESCRIPTION OF THE DRAWINGS

FIGS. 2a-2d illustrate a process of forming interposer units for use in system-in-package (SiP) modules;

FIGS. 16a-16e illustrate forming a SiP module with vertically oriented discrete devices;

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The term "semiconductor die" as used herein refers to both the singular and plural form of the words, and accordingly, can refer to both a single semiconductor device and multiple semiconductor devices. The term "semiconductor component," or simply "component," as used herein refers to active devices formed in semiconductor die, packages formed using semiconductor die, discrete active or passive devices, integrated active or passive circuits, or any other active or passive electrical part.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
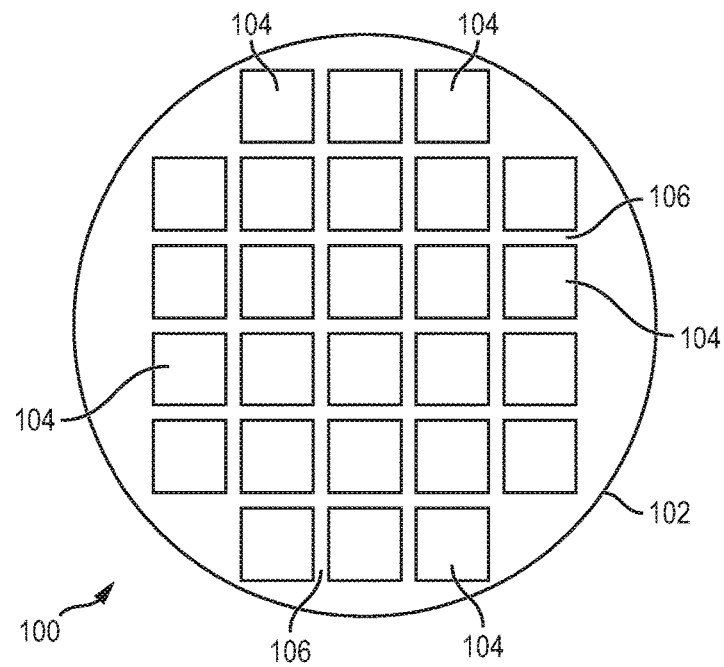
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
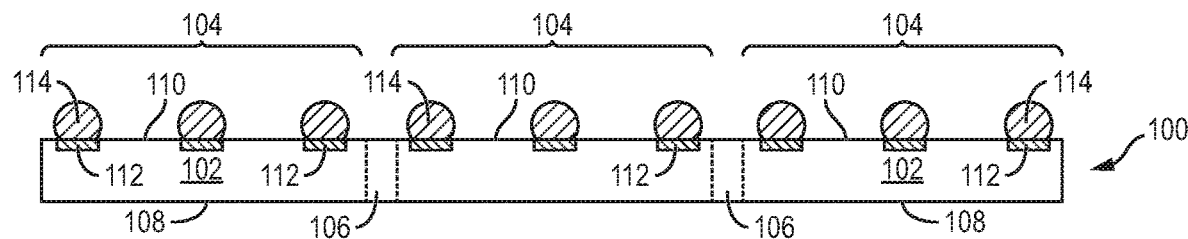

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within or over the die and electrically interconnected according to the electrical design and function of the die. The circuits may include one or more transistors, diodes, and other circuit elements formed within active surface 110 to implement analog circuits or digital circuits, such as a digital signal processor (DSP), application specific integrated circuit (ASIC), memory, or other signal processing circuit. Semiconductor die 104 may also contain IPDs, such as inductors, capacitors, and resistors formed in or on interconnect layers over surfaces of the semiconductor die for RF signal processing or other purposes. In some embodiments, semiconductor die 104 include multiple active surfaces with circuits formed in or on each active surface.

An electrically conductive layer 112 is formed over active surface 110 using PVD, CVD, electrolytic plating, electroless plating, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits of active surface 110.

An electrically conductive bump material is deposited over conductive layer 112 using an evaporation, electrolytic plating, electroless plating, ball drop, or screen printing process. The bump material can be Al, Sn, Ni, Au, Ag, lead (Pb), bismuth (Bi), Cu, solder, or a combination thereof, with an optional flux solution. For example, the bump material can be eutectic Sn/Pb, high-lead solder, or lead-free solder. The bump material is bonded to conductive layer 112 using a suitable attachment or bonding process. In some embodiments, the bump material is reflowed by heating the material above its melting point to form balls or bumps 114. In one embodiment, bumps 114 are formed over an under bump metallization (UBM) having a wetting layer, a barrier layer, and an adhesion layer. Bumps 114 can also be compression bonded or thermocompression bonded to conductive layer 112. Bumps 114 represent one type of interconnect structure that can be formed over conductive layer 112. The interconnect structures can also include bond wires, conductive paste, stud bumps, micro bumps, conductive pillars, or other electrical interconnects.

Figure 1C:
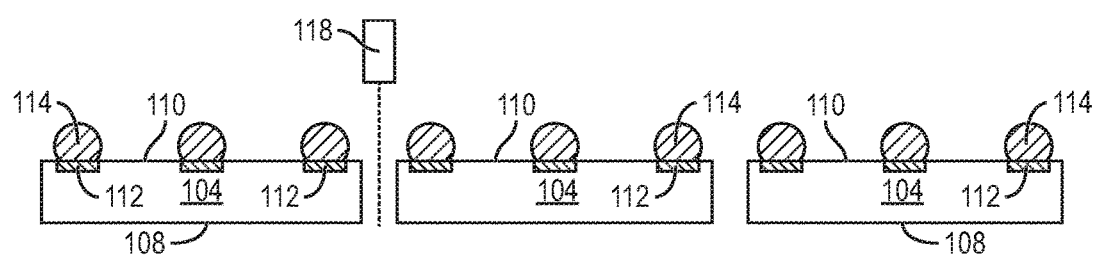

In FIG. 1c, semiconductor wafer 100 is singulated through saw street 106 using a saw blade or laser cutting tool 118 into individual semiconductor die 104. The individual semiconductor die 104 can be inspected and electrically tested for identification of known good die (KGD) before or after singulation.

Figure 2D:
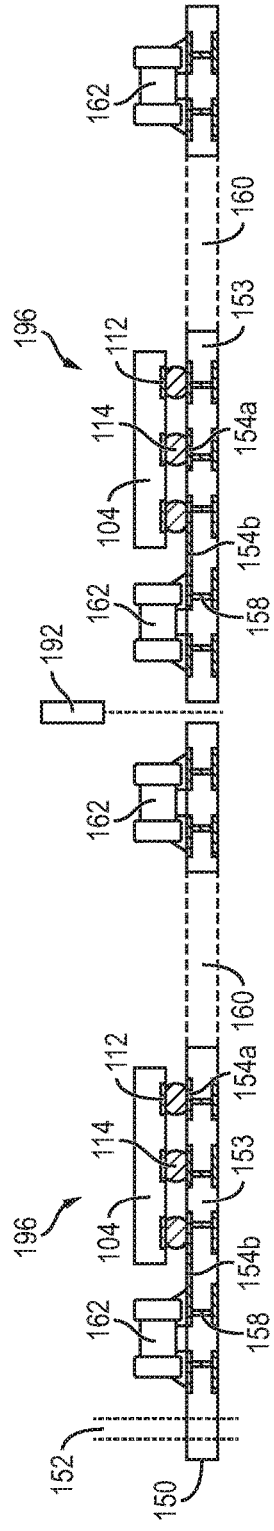

FIGS. 2a-2d illustrate a process of forming interposer units including semiconductor die 104 and other components mounted on the interposer units for integration in a SiP module. FIG. 2a shows a cross-sectional view of substrate 150 including a plurality of regions for formation of interposer units separated by saw streets 152. While only two regions for forming interposer units are shown, substrate 150 is much larger in other embodiments, with room to form hundreds or thousands of units in parallel. Substrate 150 is formed from a base insulating material 153 with conductive layers 154 and 156 formed on the two major surfaces of the insulating layer. In one embodiment, insulating material 153 is a molded substrate. In some embodiments, substrate 150 is formed using a plurality of insulating layers 153 interleaved with a plurality of conductive layers, which allows for more complicated signal routing. Portions of conductive layers 154 and 156 are electrically common or electrically isolated depending on the design and function of the SiP module being formed.

Conductive layers 154 and 156 can be one or more layers of Al, Cu, Sn, Ni, Au, Ag, or other suitable electrically conductive material. Conductive layers 154 and 156 include a plurality of contact pads, e.g., contact pads 154a, which can be coupled together by conductive traces formed as part of the conductive layer, e.g., conductive traces 154b. Conductive vias 158 extend through insulating layer 153 to electrically connect portions of conductive layer 154 to portions of conductive layer 156. Conductive layers 154 and 156 provide horizontal electrical interconnect across substrate 150, while conductive vias 158 provide vertical electrical interconnect through substrate 150. In one embodiment, conductive vias 158 are formed by providing an opening through insulating layer 153 by etching, drilling, laser ablation, or another suitable process, and then depositing or plating conductive material into the opening. In some embodiments, conductive material for conductive vias 158 is deposited into openings of insulating layer 153 as part of forming conductive layers 154 or 156.

Substrate 150 can also be any suitable laminate interposer, laminate substrate, PCB, wafer-form, strip interposer, leadframe, embedded trace substrate (ETS), or other type of substrate. Substrate 150 may include one or more laminated layers of polytetrafluoroethylene (PTFE) pre-impregnated (prepreg), FR-4, FR-1, CEM-1, or CEM-3 with a combination of phenolic cotton paper, epoxy, resin, woven glass, matte glass, polyester, and other reinforcement fibers or fabrics. Insulating layer 153 contains one or more layers of silicon dioxide (SiO2), silicon nitride (Si3N4), silicon oxynitride (SiON), tantalum pentoxide (Ta2O5), aluminum oxide (Al2O3), solder resist, polyimide, benzocyclobutene (BCB), polybenzoxazole (PBO), or other material having similar insulating and structural properties. Substrate 150 can also be a multi-layer flexible laminate, ceramic, copper clad laminate, glass, or a semiconductor wafer including an active surface containing one or more transistors, diodes, and other circuit elements to implement analog or digital circuits.

Substrate 150 includes holes or openings 160 at locations where inductors, or other taller components, are to be disposed on an underlying substrate within the SiP module footprint. Openings 160 are formed through substrate 150 using a saw blade, laser cutting tool, water cutting tool, an etching process, or another suitable mechanism for forming an opening through a substrate. In other embodiments, substrate 150 is formed in a manner that leaves openings 160 through the substrate without having to separately form an opening after the substrate is manufactured, e.g., molding insulating material 153 to include opening 160.

FIG. 2*b* illustrates a plan view of substrate 150 from the top of FIG. 2*a*. Conductive layer 154 includes a plurality of contact pads 154*a* for surface mounting semiconductor die and discrete devices as desired to implement a given electrical function, and a plurality of conductive traces 154*b* for interconnecting the contact pads per the design and function of the SiP module. Conductive layer 154 can include any desired number, shape, and layout of contact pads interconnected by conductive traces in any appropriate manner. In some embodiments, conductive layer 156 also includes conductive traces to electrically connect a plurality of contact pads to each other. Substrate 150 can be tested at the current stage seen in FIGS. 2*a* and 2*b*, prior to mounting semiconductor die and other components on the substrate.

In FIG. 2*c*, semiconductor die 104 and discrete devices 162 are surface mounted onto conductive layer 154. In some embodiments, substrate 150 is disposed on a carrier for installation of semiconductor die 104 and discrete devices 162. In other embodiments, substrate 150 is disposed in a jig. Semiconductor die 104 can be tested for KGD prior to mounting onto substrate 150 to avoid using bad die on good substrate device regions. In addition, the regions of substrate 150 can be tested prior to mounting components, and regions of the substrate with manufacturing defects can be discarded without wasting KGD on a bad substrate. In some embodiments, bad or blank semiconductor die 104 are disposed on bad regions of substrate 150 to keep weight distribution even across the substrate and help control warpage.

FIG. 2*c* shows each device region of substrate 150 having two discrete devices 162, which can be inductors, capacitors, resistors, or other passive circuit components. Discrete devices 162 can also be devices with active functionality, e.g., power transistors, transient voltage suppression diodes, etc. In other embodiments, any combination of active and passive devices can be provided on substrate 150 as desired to implement the intended functionality of a final SiP module. In one embodiment, discrete devices 162 implement a band-pass filter or another radio frequency (RF) signal processing network. In another embodiment, discrete devices 162 filter a power signal to semiconductor die 104. Discrete devices 162 can implement any desired electrical function. Discrete devices 162 operate in conjunction with other components of a final SiP module in some embodiments.

Discrete devices 162 are mechanically bonded and electrically connected to contact pads 154*a* through solder or solder paste 166. In one embodiment, solder paste 166 is printed onto substrate 150, optically inspected, reflowed with discrete devices 162 in physical contact, and then defluxed. Discrete devices 162 are dispensed from a tape and reel using a chip capacitor mounter (CCM) in some embodiments. The connections of discrete devices 162 to substrate 150 can be optically inspected again after reflow. Semiconductor die 104 are mechanically bonded and electrically connected to conductive layer 154 through conductive bumps 114. In some embodiments, bumps 114 and solder paste 166 are reflowed at the same time to surface mount all components in a single step.

In FIG. 2*d*, substrate 150 is singulated through saw streets 152 using saw blade, laser cutting tool, or water cutting tool 192, into a plurality of interposer units 196. In some embodiments, the singulated interposer units 196 are visually inspected and can be packaged into a tape and reel for storage and processing in later manufacturing steps.

Figure 3A:
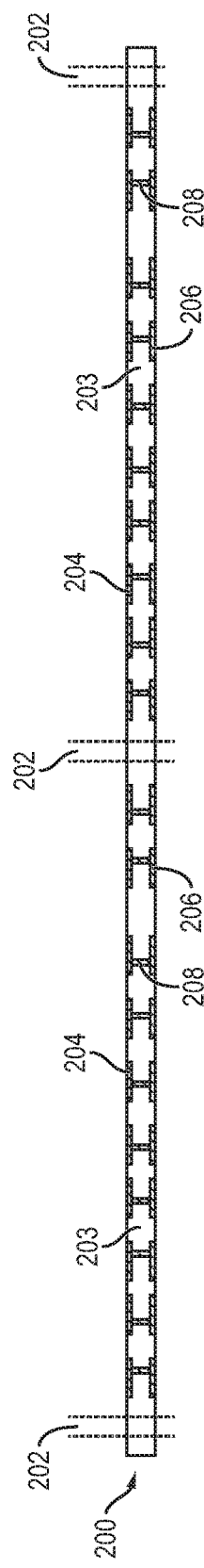
FIGS. 3a-3b illustrate forming a bottom substrate for the SiP modules.
Figure 3B:
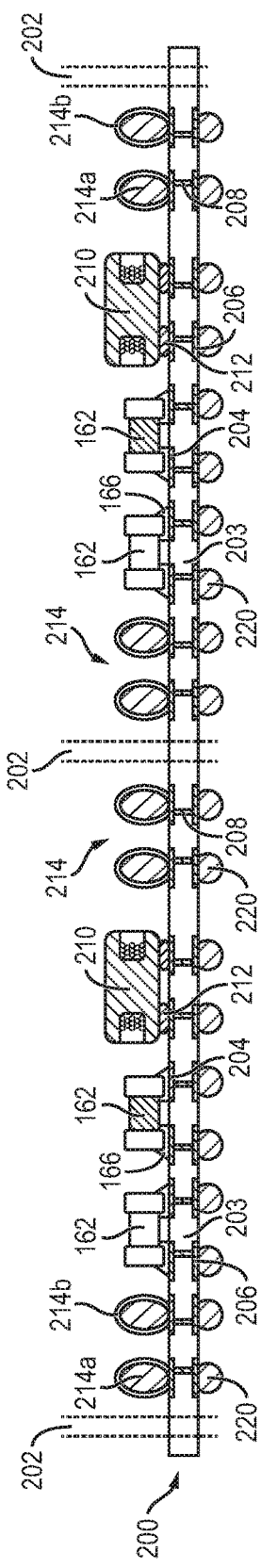

FIGS. 3*a*-3*b* illustrate forming a bottom substrate for SiP modules. The process begins in FIG. 3*a* with a substrate 200 having locations to form a plurality of bottom substrate submodules separated by saw streets 202. Substrate 200 is similar to substrate 150, and can be any of the variety of substrate types discussed above. As illustrated, substrate 200 includes one or more insulating layers 203 with conductive layers 204 and 206 on opposite sides of the substrate. Portions of conductive layers 204 and 206 are electrically connected to each other by conductive traces within the conductive layers and conductive vias 208 through substrate 200. Like substrate 150, bottom substrate 200 can be tested prior to mounting components, and the components can be tested in advance of mounting as well, to reduce waste. Substrate 200 can be disposed on a carrier or in a jig for subsequent processing.

In FIG. 3*b*, discrete devices 162 and 210 are surface mounted onto substrate 200 and electrically connected to conductive layer 204 by solder paste 166 and interconnect structures 212, respectively. Solder paste 166 is printed onto contact pads of conductive layer 204 and then inspected prior to mounting of discrete devices 162, similar to above for substrate 150. Solder paste 166 can be used for discrete device 210 in embodiments where interconnect structures 212 are contact pads or another electrical terminal with a higher reflow temperature than the solder paste. Interconnect structures 212 are solder bumps reflowed between contact pads of discrete devices 210 and conductive layer 204 in another embodiment. Discrete devices 162 on bottom substrate 200 can be identical to or different from the discrete devices on interposer units 196, and can include any appropriate active or passive component. Discrete devices 210 are components with greater heights than discrete devices 162. Discrete devices 210 are illustrated as inductors, as inductors are commonly the tallest components in many SiP modules. However, discrete devices 210 can be any component that is tall relative to other components on substrate 200.

Copper core solder balls (CCSB) 214 are disposed on conductive layer 204 of substrate 200 as vertical interconnect structures. CCSB 214 include a non-fusible core 214*a* formed from Cu or another material that can remain solid when subject to the heat applied to reflow the fusible shell 214*b*. Fusible shell 214*b* is a solder material similar to bumps 114 in one embodiment, and can be plated or otherwise coated onto non-fusible cores 214*a*. Fusible shell 214*b* can be reflowed at the same time as solder paste 166 and interconnect structures 212 to physically and electrically couple CCSB 214, discrete devices 162, and discrete devices 210 to substrate 200 in a common reflow step. In some embodiments, CCSB 214, discrete devices 162, and discrete devices 210 are optically inspected on substrate 200 prior to reflow. After reflow, CCSB 214, discrete devices 162, and discrete devices 210 can be defluxed and optically inspected again. In another embodiment, CCSB 214 are compression bonded to conductive layer 204.

Conductive bumps 220 are formed over substrate 200 opposite discrete devices 162, discrete devices 210, and CCSB 214 on contact pads of conductive layer 206. Bumps 220 are similar to bumps 114 on semiconductor die 104, and can be solder bumps, stud bumps, conductive pillars, or another suitable interconnect structure. Conductive bumps 220 can be formed prior to or after disposing components on conductive layer 204. In some embodiments, forming conductive bumps 220 is performed at a later manufacturing step. Conductive bumps 220 are affixed to conductive layer 206 by reflowing, compression bonding, or another suitable means. X-ray inspection can be used to confirm proper electrical connection for all components on substrate 200.

Figure 4A:
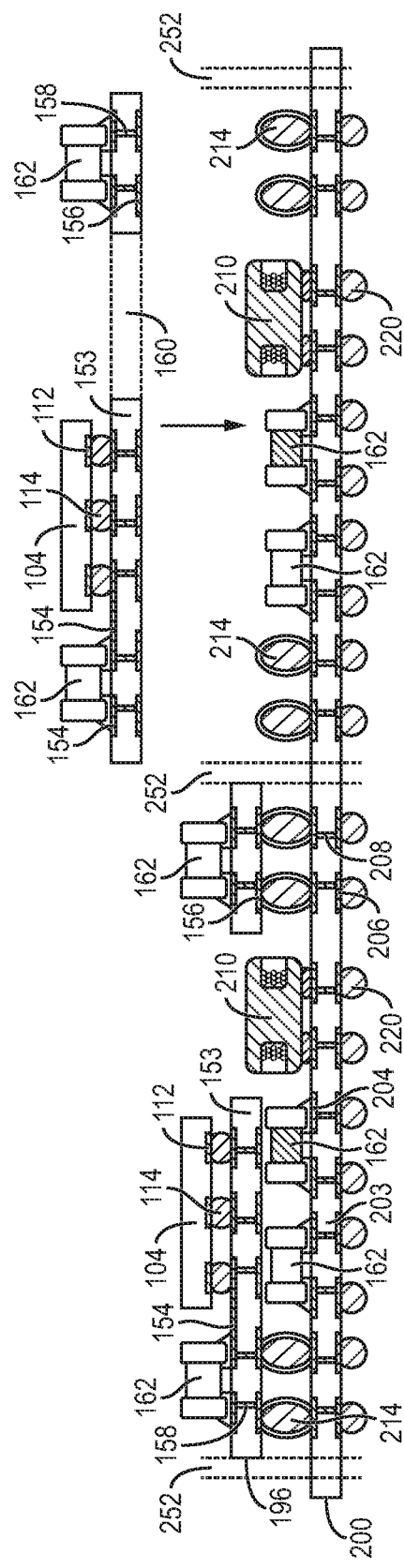
FIGS. 4a-4c illustrate forming SiP modules with the interposer units over the bottom substrates.
Figure 4B:
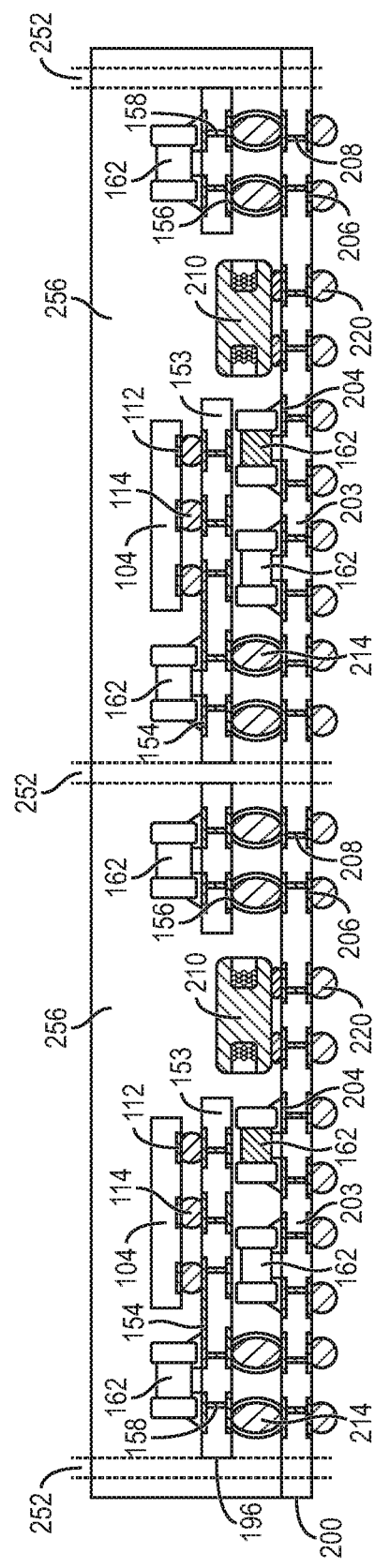
Figure 4C:
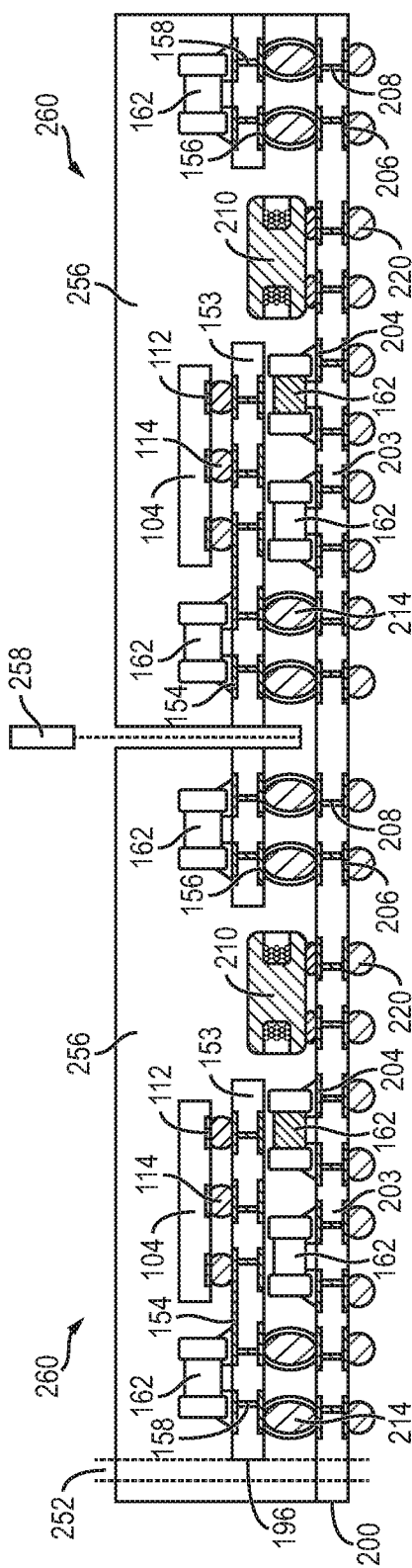

FIGS. 4a-4c illustrate a process of combining substrate 200 and interposer units 196 into SiP modules. In FIG. 4a, interposer units 196 are disposed over the top surface of substrate 200, i.e., the surface of substrate 200 that discrete devices 162 and 210 are mounted onto. If interposer units 196 were previously stored in a tape and reel, the interposer units can be disposed over substrate 200 using a CCM. In other embodiments, interposer units 196 are picked and placed from a carrier after singulation in FIG. 2d. In another embodiment, substrate 150 is disposed over substrate 200 without substrate 150 first being singulated into individual interposer units 196.

Opening 160 is aligned with the taller discrete devices 210. Opening 160 allows interposer units 196 to lie directly on CCSB 214 even though the space between the interposer units and substrate 200 is insufficient to accommodate the full height of discrete devices 210. Discrete devices 210 extend into openings 160 within the height of interposer units 196. In some embodiments, discrete devices 210 extend to over the top surface of interposer units 196.

Fusible shells 214b of CCSB 214 are reflowed to mechanically and electrically couple interposer units 196 to substrate 200 through the CCSB. Non-fusible core 214a remains solid during reflow of fusible shell 214b to maintain an offset between substrate 200 and interposer units 196. In some embodiments, contact pads of conductive layer 156 include solder paste printed thereon to improve connection to CCSB 214.

In FIG. 4b, an encapsulant or molding compound 256 is deposited over substrate 200, interposer units 196, semiconductor die 104, discrete devices 162, and discrete devices 210 using a paste printing, compressive molding, transfer molding, liquid encapsulant molding, vacuum lamination, spin coating, or other suitable applicator. Encapsulant 256 can be polymer composite material, such as epoxy resin, epoxy acrylate, or polymer with or without filler. Encapsulant 256 is non-conductive, provides structural support, and environmentally protects the semiconductor device from external elements and contaminants. Encapsulant 256 flows below semiconductor die 104 between conductive bumps 114, below discrete devices 162 between solder paste 166, and below discrete devices 210 between interconnect structures 212 to completely fill the space between substrate 200 or interposer units 196 and the semiconductor die and discrete devices. In other embodiments, a separate underfill is used for some or all components.

Encapsulant 256 undergoes a post-mold cure in some embodiments, followed by an optional laser marking. The combination of substrate 200 and interposer units 196 covered with encapsulant 256 forms a panel of SiP modules. In some embodiments, encapsulant 256 is deposited thicker than necessary and backgrinded to reduce a thickness of the encapsulant. Backgrinding is performed using chemical mechanical planarization (CMP), an etching process, laser direct ablation (LDA), or another suitable thinning procedure.

In FIG. 4c, the panel is singulated through substrate 200 and encapsulant 256 at saw streets 252 using saw blade, laser cutting tool, or water cutting tool 258, into a plurality of SiP modules 260. In some embodiments, the panel is cut through a portion of interposer units 196. In other embodiments, the panel is singulated such that a portion of encapsulant 256 remains between side surfaces of interposer units 196 and side surfaces of SiP modules 260.

In one embodiment, bumps 220 are not formed prior to depositing encapsulant 256. The encapsulated panel can be flipped and disposed on a carrier with substrate 200 oriented away from the carrier for bumping after encapsulation and before singulation.

Figure 5:
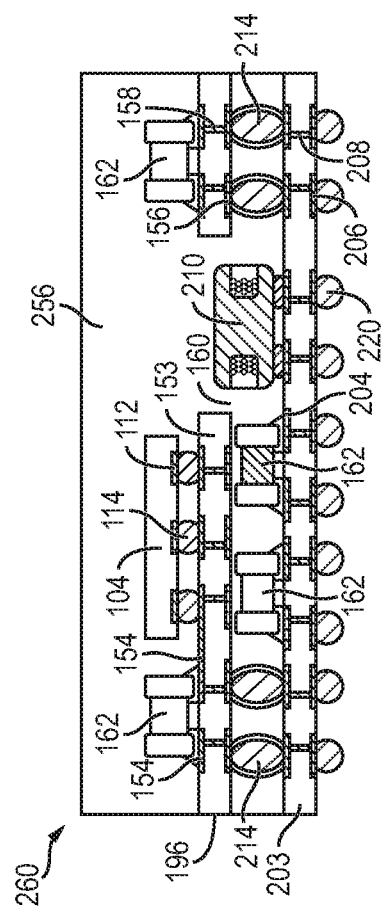
FIG. 5 illustrates a completed SiP module.

FIG. 5 illustrates a singulated SiP module 260. SiP module 260 can be lead inspected, and undergo other external visual inspection and testing before baking and shipping. Conductive bumps 220 are configured to allow SiP module 260 to be mounted onto a PCB or other substrate of a larger electronic device for system integration. Discrete devices 162 and 210 on substrate 200 are electrically coupled to conductive bumps 220 through conductive layer 204, conductive vias 208, and conductive layer 206. Discrete devices 162 and semiconductor die 104 of interposer unit 196 are coupled to conductive bumps 220 by conductive layer 154, conductive vias 158, conductive layer 156, CCSB 214, conductive layer 204, conductive vias 208, and conductive layer 206. In some embodiments, conductive traces of conductive layers 154, 156, 204, or 206 electrically couple discrete devices 162, discrete devices 210, and semiconductor die 104 to each other internal to SiP module 260 in any desired configuration. In one embodiment, one or more terminals of the discrete devices 162 on substrate 200 can be directly coupled to interposer unit 196 by solder paste printed on conductive layer 156, or another interconnect structure, as illustrated below in FIGS. 16a-16e, 17a, 17b, and 18-22.

SiP module 260 provides a plurality of components, each usable by the larger electronic device, in a single easy to integrate package. Discrete device 210 is a relatively tall component. Discrete device 210 is disposed within a footprint of opening 160, which allows discrete device 210 and interposer unit 196 to occupy the same vertical dimension without interfering with each other. The height of discrete devices 210 extends to within a height of interposer unit 196. In some embodiments, discrete device 210 extends completely over the height of interposer unit 196, and may extend to a height above the tops of discrete devices 162 or semiconductor die 104 on interposer unit 196. Opening 160 allows an interposer to be used over shorter discrete devices 162 without interfering with the taller height of discrete device 210.

The use of interposer units 196 allows additional components within SiP module 260 without having to increase the footprint of substrate 200. In some embodiments, discrete device 210 is so tall that interposer units 196 can be added over the shorter discrete devices 162 without adding to the thickness of SiP module 260. Electrical performance is improved by reducing signal paths relative to having each component spread out on a single substrate.

Figure 6A:
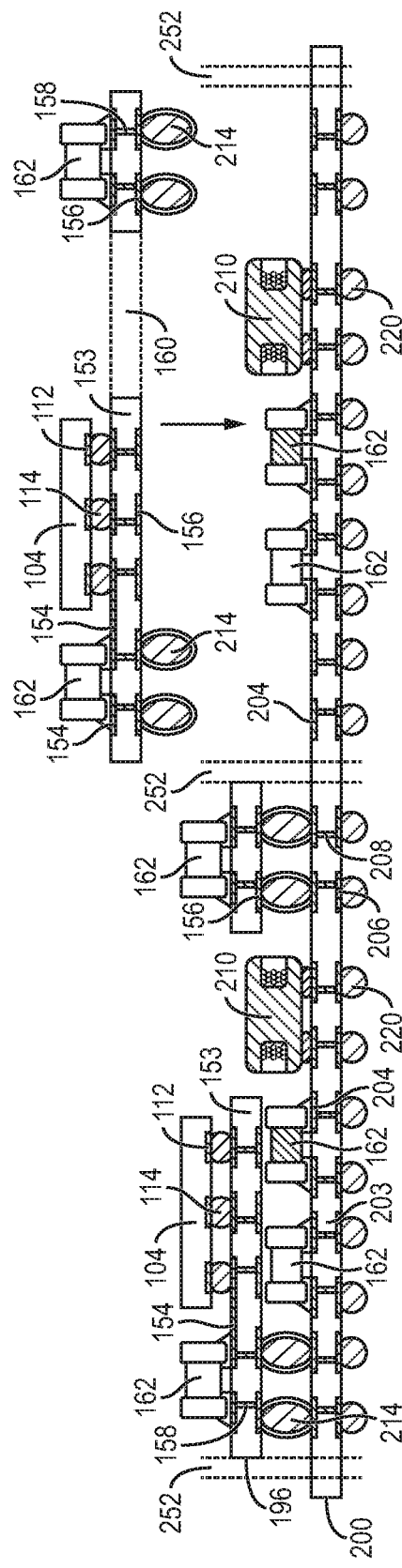
FIGS. 6a-6b illustrate alternative process options for manufacturing the SiP modules.
Figure 6B:
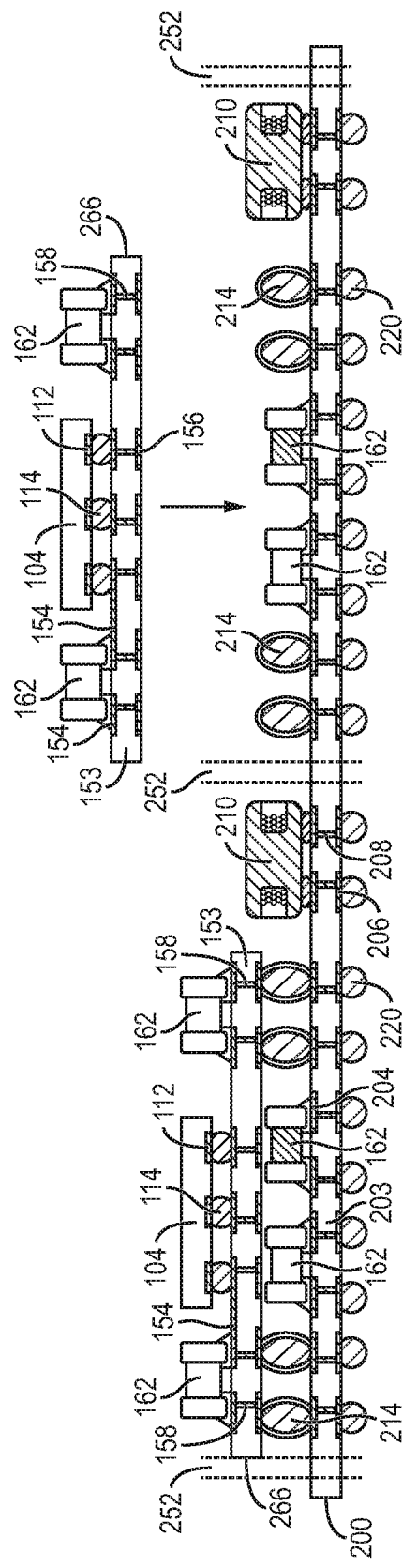

FIGS. 6a and 6b illustrate two manufacturing variations. In FIG. 6a, CCSB 214 are initially disposed or formed on conductive layer 156 of substrate 150 during the manufacturing process of interposer units 196. Interposer units 196 with CCSB 214 are disposed over substrate 200, and then fusible shell 214b is bonded to conductive layer 204 through reflow, compression bonding, or another suitable means. In some embodiments, solder paste is printed onto conductive layer 204 under CCSB 214 to improve the connection. Solder paste for CCSB 214 can be printed during the same printing process as solder paste 166 for discrete devices 162. The structure is encapsulated and singulated as illustrated in FIGS. 4b-4c to form a SiP module substantially the same as in FIG. 5, but formed with CCSB initially on interposer units 196 instead of substrate 200.

FIG. 6b illustrates forming SiP modules with interposer units 266 replacing interposer units 196. Interposer units 266 are formed in a similar manner to interposer units 196. However, rather than including openings 160 formed through the interposer unit, interposer units 266 are made with a smaller footprint compared to the size of a unit of substrate 200. The smaller footprint of interposer unit 266 allows room for the taller discrete devices 210 to be disposed on substrate 200 outside a footprint of the interposer unit. Again, the structure with interposer units 266 is encapsulated and singulated as illustrated in FIGS. 4b-4c to form a SiP module similar to SiP module 260 in FIG. 5, but with discrete device 210 adjacent to or completely outside a footprint of the interposer unit rather than in an opening of the interposer unit.

Figure 7:
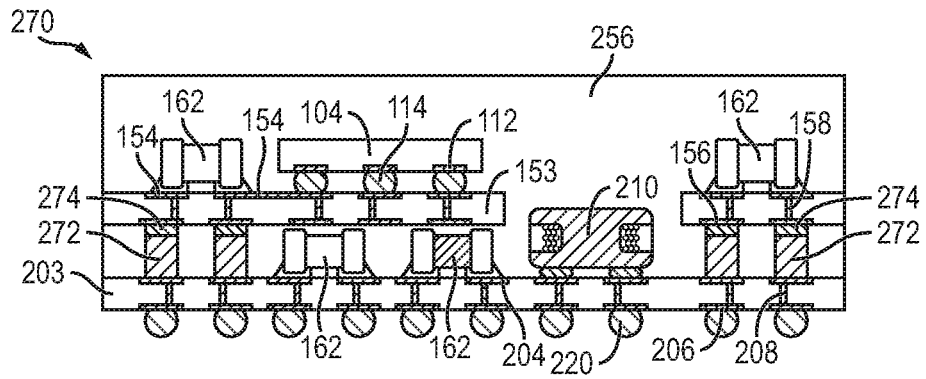
FIG. 7 illustrates a SiP module with conductive pillars as the vertical interconnect structure between the interposer and bottom substrate.

FIG. 7 illustrates a SiP module 270 with conductive pillars 272 used as the vertical interconnect structure instead of CCSB 214. Conductive pillars 272 are formed from Cu, Al, Au, Ag, another suitable conductive material, or combinations thereof. Conductive pillars 272 are plated onto conductive layer 204 into a mask opening in one embodiment. Solder caps 274 can be formed by depositing solder or another fusible material into the same mask opening used to form conductive pillars 272. Solder cap 274 is bonded to conductive layer 156 by reflow, compression bonding, or another suitable means. In another embodiment, conductive pillars 272 are plated onto conductive layer 156 and then bonded to conductive layer 204 with solder cap 274.

Figure 8:
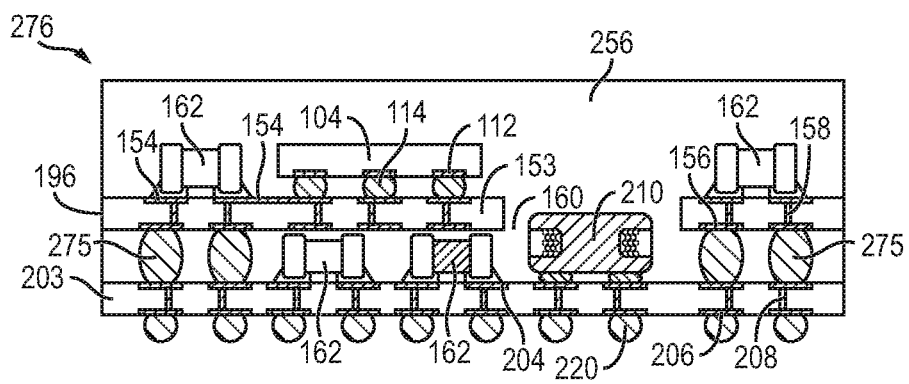
FIG. 8 illustrates a SiP module with solder balls as the vertical interconnect structure.

FIG. 8 illustrates a SiP module 276 that is manufactured using solder balls 275 instead of CCSB 214. Solder balls 275 are a uniform body of solder, e.g., Sn—Pb, Sn—Ag, Sn—Ag—Cu, or other suitable solder compositions. Solder balls 275 reflow completely when attaching interposer units 196 to substrate 200, unlike CCSB 214 where only the outer shell 214b reflows. Solder balls 275 do not provide the same degree of standoff capability as CCSB 214, which have a non-fusible core, but are satisfactory for many embodiments.

Figure 9A:
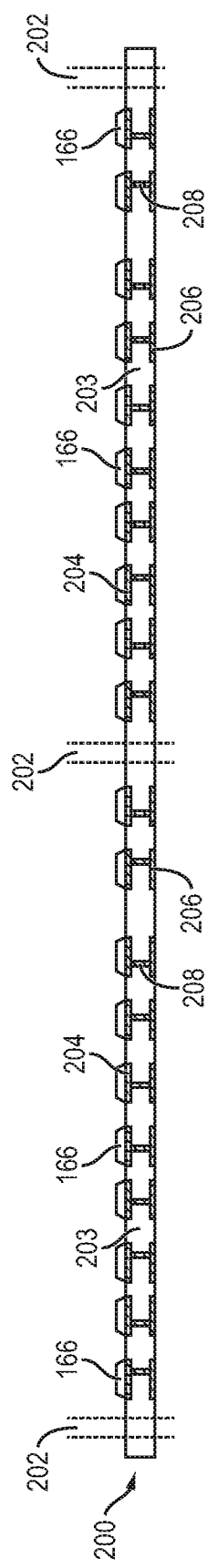
FIGS. 9a-9d illustrate forming a SiP module with copper balls as the vertical interconnect structure.

FIGS. 9a-9d illustrate forming a SiP module with copper balls 214a as the vertical interconnect, without the solder coating 214b. In FIG. 9a, solder or solder paste 166 is printed or otherwise disposed on contact pads of conductive layer 204. Solder paste 166 is provided at locations for discrete devices 162 as above, but is also provided at locations where vertical interconnect to interposer units 196 is desired. In some embodiments, solder paste 166 is also printed at locations where discrete device 210 is to be connected to substrate 200.

Figure 9B:
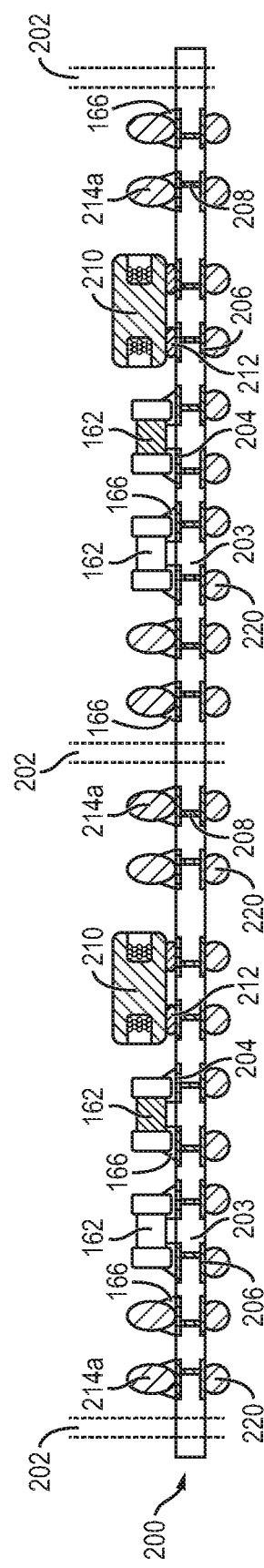

In FIG. 9b, discrete devices 162 and 210 are disposed on substrate 200 as in FIG. 3b. In addition, copper balls 214a are disposed on contact pads of conductive layer 204 over solder paste 166. As above, copper balls 214a can be formed from copper or another suitable metal that does not reflow with solder paste 166. Solder paste 166 is reflowed to mechanically bond copper balls 214a to substrate 200.

Figure 9C:
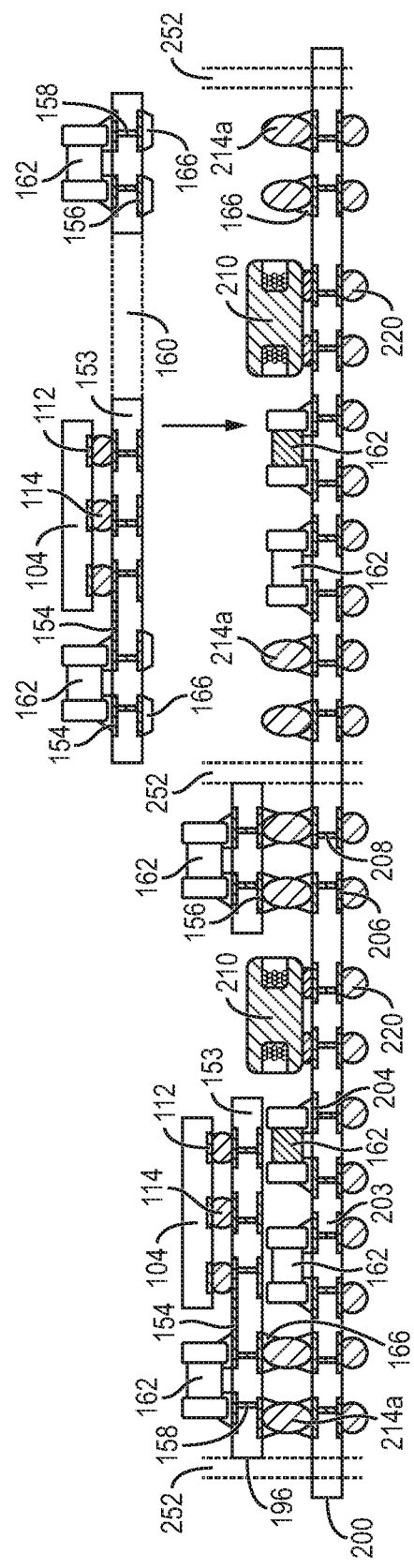
Figure 9D:
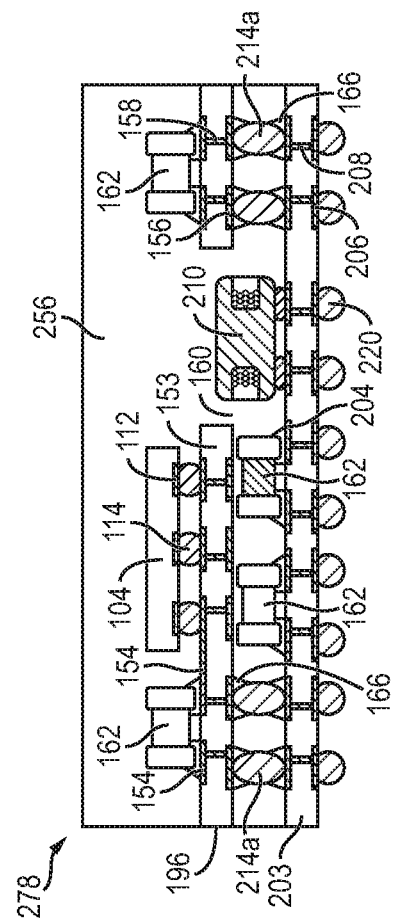

In FIG. 9c, interposer units 196 are disposed over substrate 200 and copper balls 214a. Solder paste 166 has previously been disposed on conductive layer 156 at locations to be aligned with copper balls 214a. Solder paste 166 is reflowed to bond copper balls 214a to interposer units 196. The SiP modules are encapsulated and singulated as above, resulting in the SiP module 278 in FIG. 9d. Copper balls 214a are used in a similar manner as in SiP module 260, i.e., to provide physical standoff as well as electrical interconnection, but are connected with a separate solder paste 166 rather than a solder coating 214b.

Figure 10:
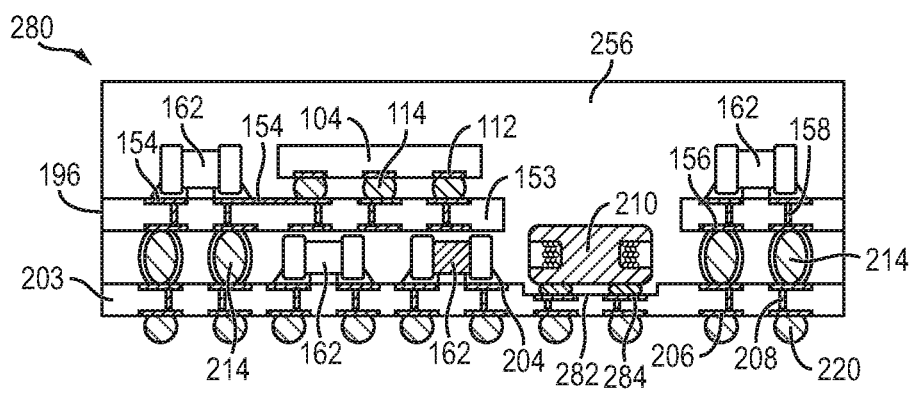
FIG. 10 illustrates a SiP module with an inductor mounted on contact pads embedded in the bottom substrate.

FIG. 10 illustrates a SiP module 280 with discrete device 210 disposed in a recess 282 of substrate 200 on an intermediate conductive layer 284. Substrate 200 in FIG. 10 includes at least one intermediate conductive layer 284 between layers of insulating material 203, and between conductive layers 204 and 206 on the top and bottom surfaces of the substrate. Intermediate conductive layer 284 can be used to laterally route electrical signals between conductive layers 204 and 206 by including conductive traces as part of conductive layer 284. Portions of conductive layer 284 are located or extend outside a footprint of recess 282 in some embodiments. SiP module 280 is formed in substantially the same manner as SiP module 260 above, but with discrete device 210 disposed on conductive layer 284 in recess 282 rather than on conductive layer 204.

In some embodiments, recess 282 is formed by etching away upper insulating layers 203 to expose the intermediate conductive layer 284. In other embodiments, recess 282 extends completely through insulating material 203 to expose conductive layer 206, and discrete device 210 is disposed on conductive layer 206 directly opposite conductive bumps 220. Placing discrete device 210 in a recess lowers the height of discrete device 210, allowing taller discrete devices 210 without significantly increasing the size of the SiP module.

Figure 11A:
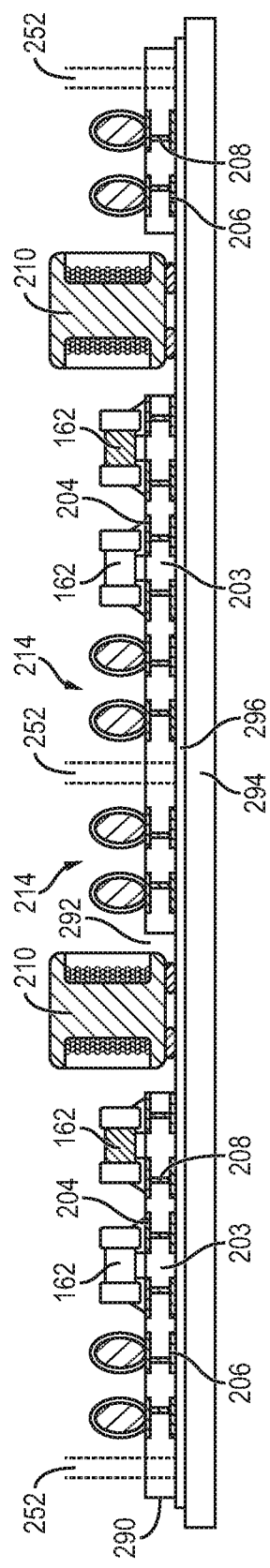
FIGS. 11a-11c illustrate forming SiP modules with inductors in openings of the bottom substrate
Figure 11B:
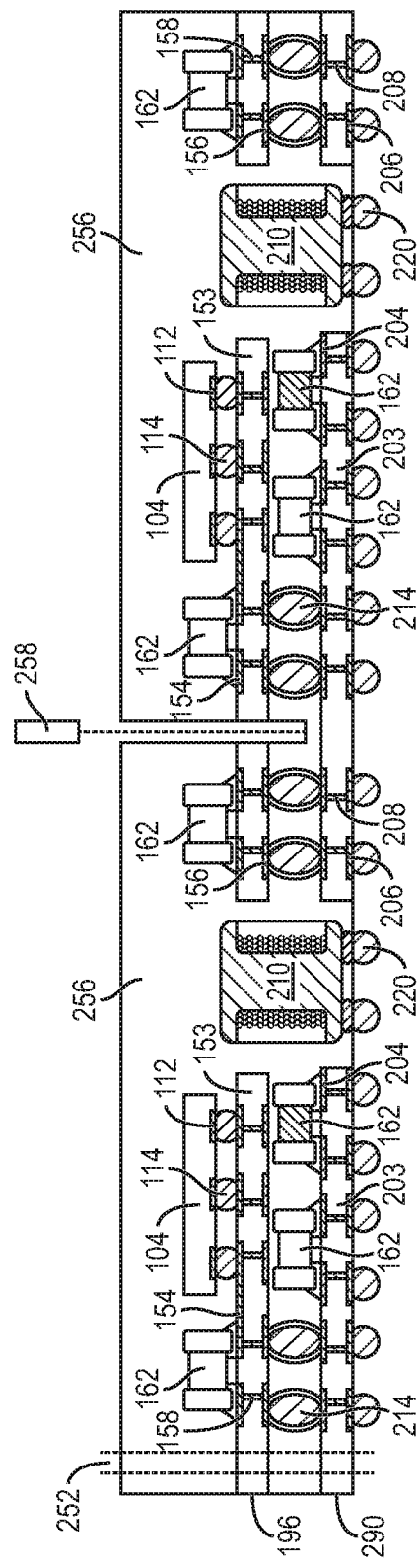
Figure 11C:
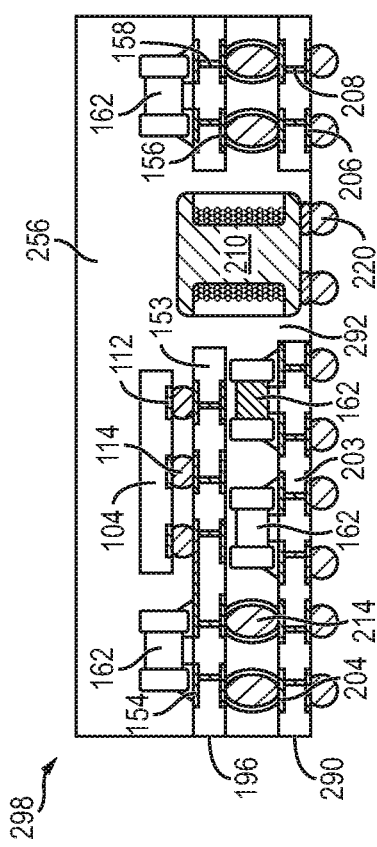

FIGS. 11a-11c illustrate forming a SiP module with discrete device 210 formed in an opening completely through the bottom substrate. FIG. 11a illustrates a bottom substrate 290 with opening 292 formed through the substrate at locations for the taller discrete devices 210. Substrate 290 is substantially the same as substrates 150 and 200 above, and opening 292 is formed through the substrate similarly to opening 160. Substrate 290 is disposed on a carrier 294 with optional thermal release layer, double-sided tape, or other interface layer 296. Interface layer 296 can include an adhesive property to help keep substrate 290 and discrete devices 210 in place during processing. In some embodiments, a tape is laminated onto the bottom of substrate 290 to hold components in opening 292 while substrate 290 is disposed in a jig.

Discrete devices 210 are disposed in openings 292 with interconnect structures 212 in contact with interface layer 296. When carrier 294 and interface layer 296 are subsequently removed, interconnect structures 212 are exposed, along with the contact pads of conductive layer 206, for electrical interconnect. Interconnect structures 212 are contact pads similar to those of conductive layer 206 in one embodiment. In another embodiment, interconnect structures 212 are solder bumps similar to bumps 114 or solder paste similar to solder paste 166. Discrete devices 162 and CCSB 214 are mounted on substrate 290, as with substrate 200 above, either before or after disposal on carrier 294.

Also as above, interposer units 196 are disposed over each of the units of substrate 290 and encapsulated in FIG. 11b.

Carrier 294 and interface layer 296 are removed by mechanical peeling, thermal release, UV release, or another appropriate mechanism to expose conductive layer 206 and interconnect structures 212. Conductive bumps 220 are applied as above. In embodiments where interconnect structures 212 include solder bumps, interconnect structures 212 can be reflowed together with corresponding bumps 220 to form a single continuous body of solder.

The panel is singulated through encapsulant 256 and substrate 290 to form individual SiP modules 298 in FIG. 11c. Opening 292 through substrate 290 allows the use of a discrete device 210 that is nearly the same height as the entire thickness of SiP module 298 without interference with substrate 290 or interposer unit 196. At the same time, other shorter components are stacked above each other onto two separate substrates, i.e., substrate 290 and interposer unit 196, to increase component density.

Figure 12A:
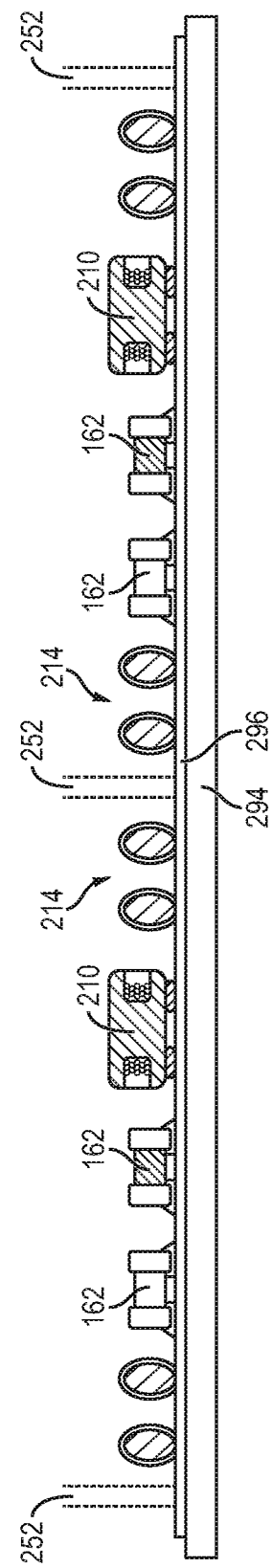
FIGS. 12a-12c illustrate forming SiP modules without the bottom substrate
Figure 12B:
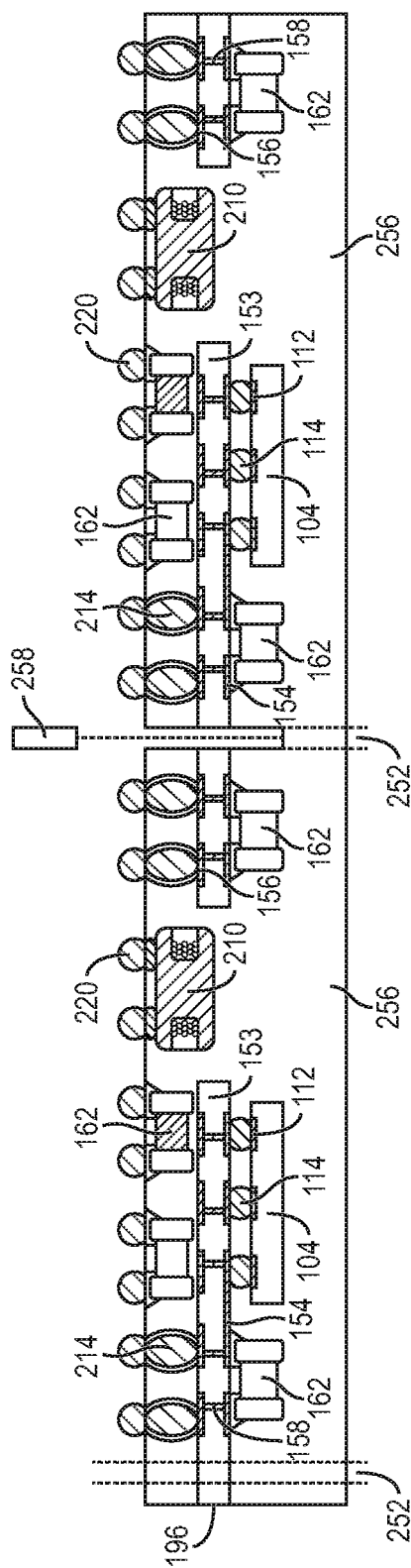
Figure 12C:
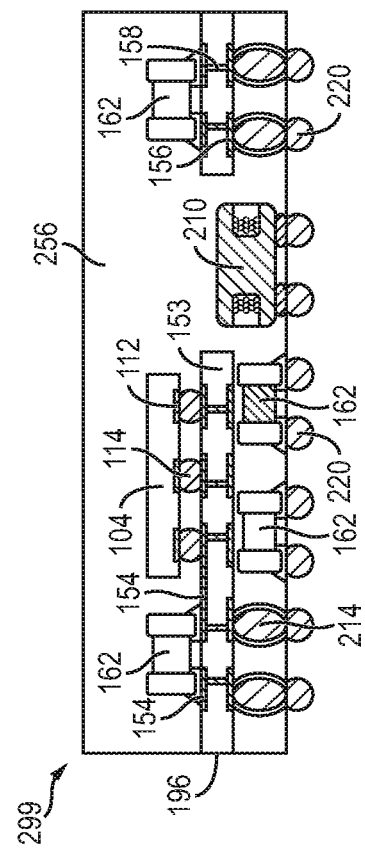

FIGS. 12a-12c illustrate forming SiP modules without a bottom substrate. In FIG. 12a, CCSB 214, discrete devices 162, and discrete devices 210 are all disposed directly on carrier 294 and interface layer 296. An adhesive property of interface layer 296 is used to hold the components in place in one embodiment. Interposer units 196 are disposed on CCSB 214 as above. The structure is encapsulated to form a panel. The panel is optionally flipped onto another carrier for application of bumps 220, and then singulated in FIG. 12b.

FIG. 12c illustrates SiP module 299 singulated from the panel in FIG. 12b. SiP module 299 is similar to the above embodiments, but without a bottom substrate. Conductive bumps 220 are disposed directly on CCSB 214, interconnect structures 212, and solder paste 166. In some embodiments, solder paste 166 is absent; discrete devices 162 are disposed directly on interface layer 296 without solder paste 166, and bumps 220 are disposed directly on terminals of discrete devices 162 after removal of carrier 294. Conductive bumps 220 are reflowed together with fusible shell 214b to form a uniform body of solder around core 214a in some embodiments.

Figure 13:
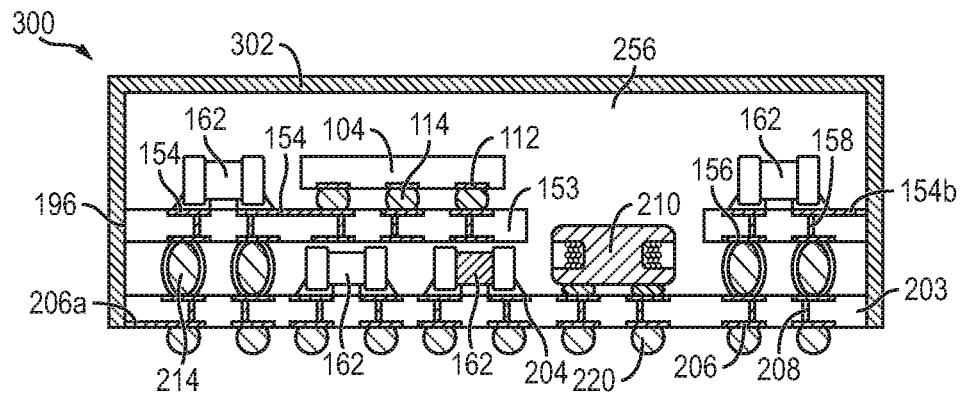
FIG. 13 illustrates a SiP module with an electromagnetic interference (EMI) shielding layer.

FIG. 13 illustrates SiP module 300 with shielding layer 302 formed over the package. SiP module 300 is similar to SiP module 260, but formed with a process that allows shielding layer 302 to be plated over the packages. In one embodiment, shielding layer 302 is sputtered over the SiP modules after singulation in FIG. 4c, but prior to removing the SiP modules from a carrier for packaging in a tape and reel. Shielding layer 302 is optionally electrically coupled to a ground node of an underlying substrate through a conductive trace 154b of conductive layer 154 that is routed to the edge of substrate 150 to contact the shielding layer or a portion 206a of conductive layer 206. Shielding layer 302 may also be coupled to a ground node through conductive layer 204 or 156. Shielding layer 302 helps protect components within SiP module 300 from interference caused by external sources of electromagnetic radiation. Shielding layer 302 may also be used to reduce interference by radiation from SiP module 300 on nearby devices external to the SiP module. Shielding layer 302 is compatible with any of the above or below described SiP modules.

Figure 14:
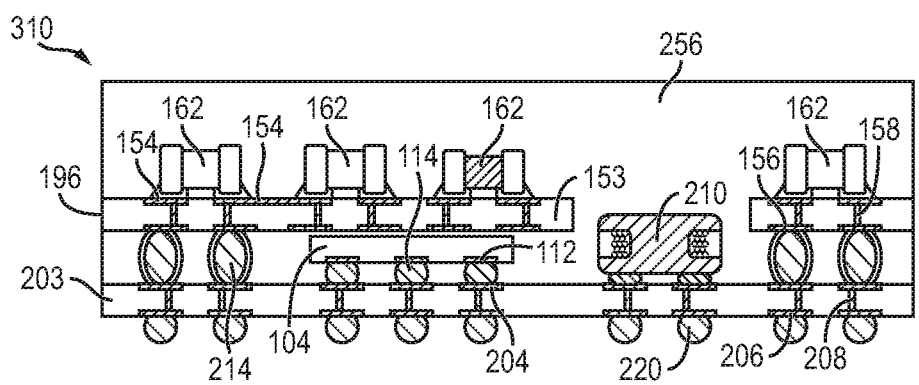
FIG. 14 illustrates a SiP module with an alternate organization of components.

The actual layout of discrete devices 162, semiconductor die 104, and discrete devices 210 is not limited to the disclosed embodiments. Any combination of active and passive components can be placed on either one of interposer unit 196 or substrate 200. FIG. 14 illustrates a SiP module 310 with semiconductor die 104 disposed on bottom substrate 200 rather than interposer unit 196 as above. In other embodiments, only passive devices are used. The taller discrete devices 210 can also be in any location within the footprint of a SiP module, and openings 160 are formed through interposer units 196 in corresponding locations.

Figure 15A:
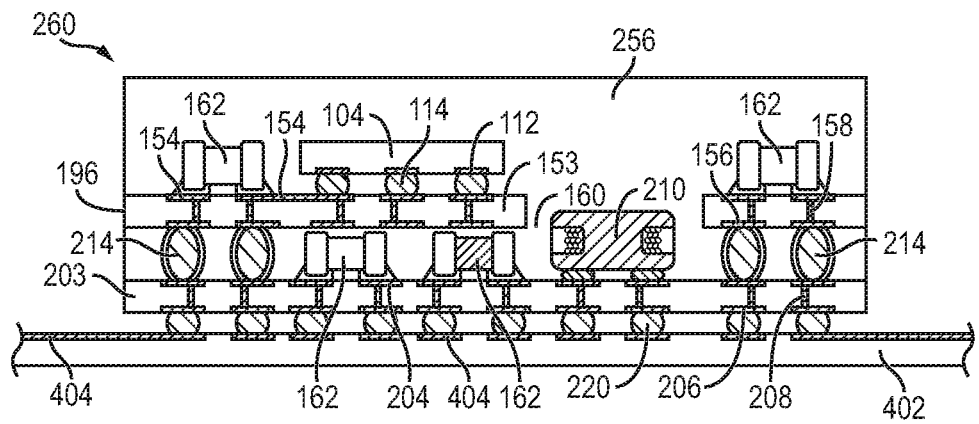
FIGS. 15a-15b illustrate a printed circuit board (PCB) with a SiP module mounted to a surface of the PCB.
Figure 15B:
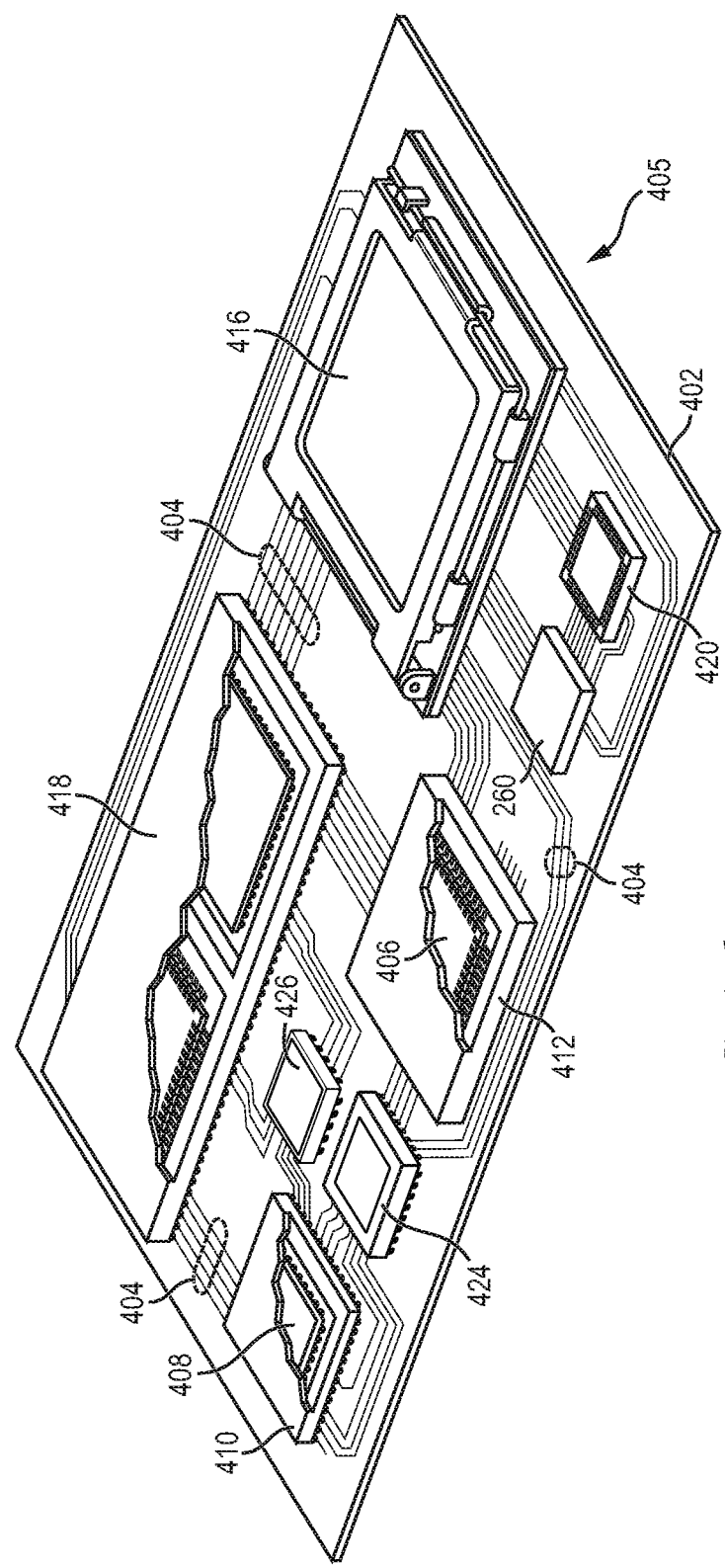

FIGS. 15a-15b illustrate incorporating the above described SiP modules into an electronic device. FIG. 15a illustrates a partial cross-section of SiP module 260 from FIG. 5 mounted onto a PCB or other substrate 402 as part of an electronic device. Bumps 220 are reflowed onto conductive layer 504 to physically attach and electrically connect SiP module 260 to PCB 402. Any of the above described SiP modules can similarly be mounted onto PCB 402. In other embodiments, thermocompression or other suitable attachment and connection methods are used. In some embodiments, an adhesive or underfill layer is used between SiP module 260 and PCB 402.

Semiconductor die 104 is electrically coupled to conductive layer 404 through bumps 114, substrate 150, CCSB 214, substrate 200, and bumps 220. Discrete devices 162 and 210 are coupled to conductive layer 404 through solder paste 166, interconnect structures 212, substrate 150, CCSB 214, substrate 200, and bumps 220. In some embodiments, substrates 150 and 200 couple semiconductor die 104 and discrete devices 162 to each other. In other embodiments, conductive layer 404 couples semiconductor die 104, discrete devices 162, and discrete devices 210 to each other.

FIG. 15b illustrates electronic device 405 including PCB 402 with a plurality of semiconductor packages mounted on a surface of the PCB, including SiP module 260. Electronic device 405 can have one type of semiconductor package, or multiple types of semiconductor packages, depending on the application.

Electronic device 405 can be a stand-alone system that uses the semiconductor packages to perform one or more electrical functions. Alternatively, electronic device 405 can be a subcomponent of a larger system. For example, electronic device 405 can be part of a tablet computer, cellular phone, digital camera, communication system, or other electronic device. Electronic device 405 can also be a graphics card, network interface card, or other signal processing card that is inserted into a computer. The semiconductor packages can include microprocessors, memories, ASICs, logic circuits, analog circuits, RF circuits, discrete active or passive devices, or other semiconductor die or electrical components.

In FIG. 15b, PCB 402 provides a general substrate for structural support and electrical interconnection of the semiconductor packages mounted on the PCB. Conductive signal traces 404 are formed over a surface or within layers of PCB 402 using evaporation, electrolytic plating, electroless plating, screen printing, or other suitable metal deposition process. Signal traces 404 provide for electrical communication between each of the semiconductor packages, mounted components, and other external systems or components. Traces 404 also provide power and ground connections to each of the semiconductor packages as needed.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to PCB 402. In other embodiments, a semiconductor device may only have the first level packaging where the die is mechanically and electrically mounted directly to PCB 402.

For the purpose of illustration, several types of first level packaging, including bond wire package 406 and flipchip 408, are shown on PCB 402. Additionally, several types of second level packaging, including ball grid array (BGA) 410, bump chip carrier (BCC) 412, land grid array (LGA) 416, multi-chip module (MCM) 418, quad flat non-leaded package (QFN) 420, embedded wafer level ball grid array (eWLB) 424, and wafer level chip scale package (WLCSP) 426 are shown mounted on PCB 402 along with SiP module 260. In one embodiment, eWLB 424 is a fan-out wafer level package (Fo-WLP) and WLCSP 426 is a fan-in wafer level package (Fi-WLP). Conductive traces 404 electrically couple the various packages disposed on substrate 402 to SiP module 260 for access to the components within the SiP module.

Depending upon the system requirements, any combination of semiconductor packages, configured with any combination of first and second level packaging styles, as well as other electronic components, can be connected to PCB 402. In some embodiments, electronic device 405 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 16C:
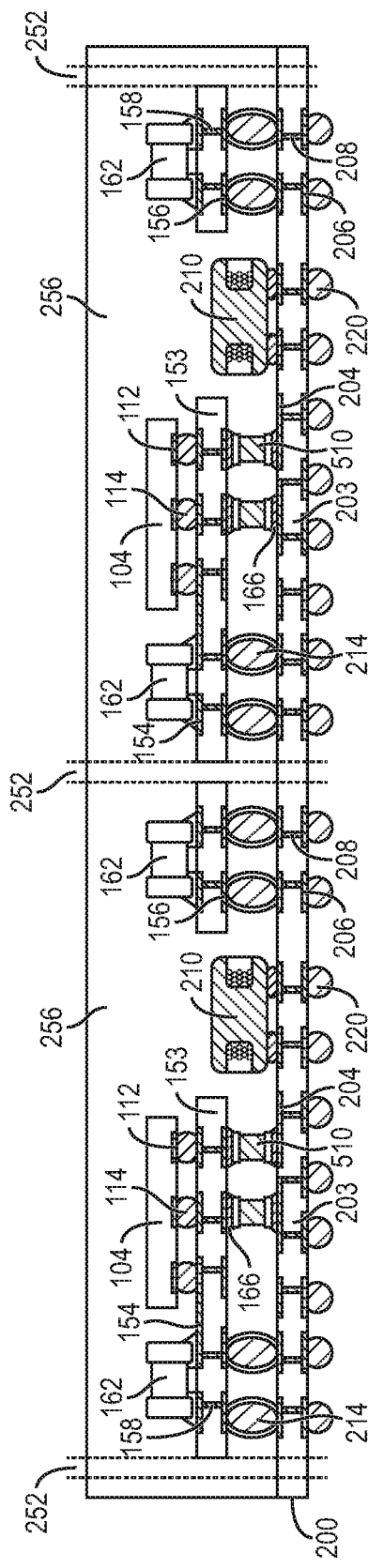

FIGS. 16a-16e illustrate forming a SiP module with vertically oriented discrete devices disposed between the bottom substrate and interposer substrate. FIG. 16a illustrates formation of SiP submodules 500 from substrate 150, similar to FIG. 2c. However, after mounting discrete devices 162 and semiconductor die 104 over substrate 150, the substrate is flipped for mounting of CCSB 214 and discrete devices 510. Similar to discrete devices 162, discrete devices 510 can be any desired discrete electrical component, e.g., capacitor, inductor, resistor, diode, transistor, etc. CCSB 214 are formed and mounted as in FIG. 3b, but are disposed on conductive layer 156 of substrate 150 rather than conductive layer 204 of substrate 200. In other embodiments, other types of vertical interconnect structures are used instead of CCSB, e.g., solder bumps, stud bumps, copper balls, copper posts, or conductive pillars. Discrete devices 510 and CCSB 214 can be initially mounted on either substrate 150 or substrate 200 before assembling the two substrates into a SiP module.

Discrete devices 510 are similar to discrete devices 162, but may include different dimensions depending on the requirements of the specific embodiments. For instance, discrete devices 510 may need to have shorter lengths between the terminals to fit lengthwise between substrates 150 and 200. The thickness of discrete devices 510 may be increased in another dimension to make up for the lower length, and create a discrete device with a substantially similar overall volume. In other embodiments, discrete devices 510 are simply smaller devices than discrete devices 162.

Discrete devices 510 include solder paste 166 on both terminals. Solder paste 166 can be any suitable material that is electrically conductive and provides mechanical coupling between discrete devices 510 and substrate 150 and 200. Solder paste 166 can be solder melted onto the terminals of discrete devices 510, a solder paste with solder particles suspended in flux, a conductive adhesive, or any other suitable composition. In one embodiment, discrete devices 510 are dipped into a container of solder paste 166 to apply the solder paste onto the terminals. In another embodiment, solder paste 166 is printed onto the substrates.

Substrate 150 is singulated into SiP submodules 500 as in FIG. 2d. Then in FIG. 16b, SiP submodules 500 are mounted onto substrate 200 as in FIG. 4a. Solder paste 166 and the fusible shell of CCSB 214 are reflowed to mechanically and electrically connect SiP modules 500 to substrate 200. Portions of conductive layer 156 are electrically coupled to portions of conductive layer 204 through discrete devices 510. Both discrete devices 510 and CCSB 214 provide electrical and mechanical connection between substrate 150 and substrate 200.

Figure 16D:
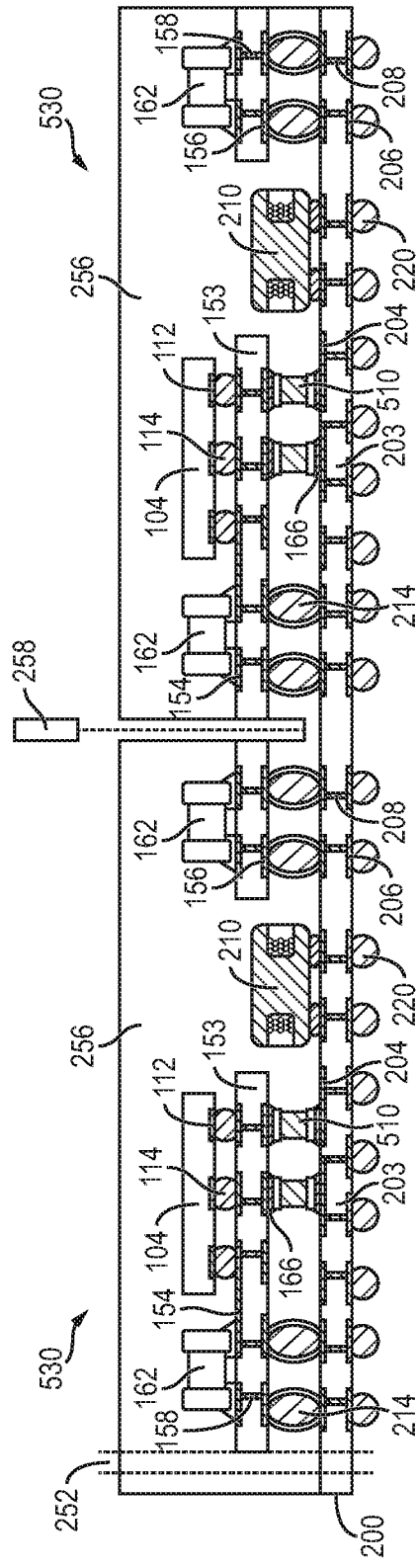

In FIG. 16c, encapsulant 256 is deposited over substrate 200 and SiP submodules 520 as in FIG. 4b. Encapsulant 256 flows between substrate 150 and substrate 200, surrounding CCSB 214 and discrete devices 510. In FIG. 16d, the panel is singulated into individual SiP modules 530 as in FIG. 4c.

Figure 16E:
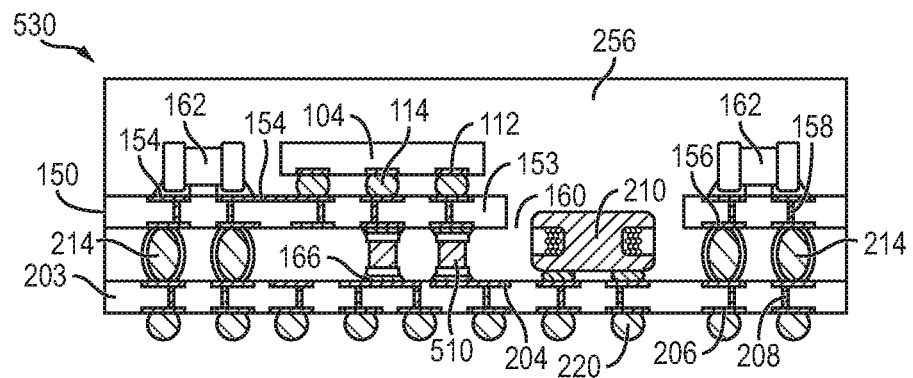

FIG. 16e illustrates an individual SiP module 530 with vertically oriented discrete devices 510. Discrete devices 510 provide an electrical path from substrate 150 to substrate 200 as well as performing a desired electrical function. Orienting discrete devices 510 vertically between substrate 150 and 200 saves space relative to having a horizontally oriented discrete device in combination with an additional CCSB 214 for vertical interconnect. Discrete devices 510 accomplish both vertical interconnect and a desired electrical function.

Figure 17A:
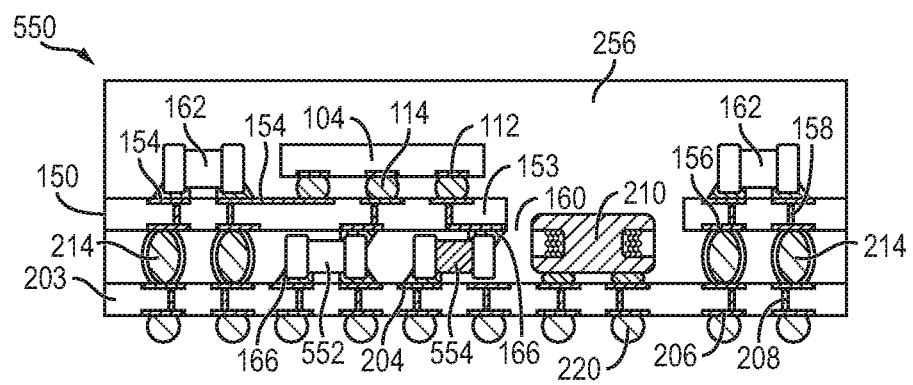
FIGS. 17a and 17b illustrate a SiP module with horizontally oriented discrete devices that are coupled vertically.
Figure 17B:
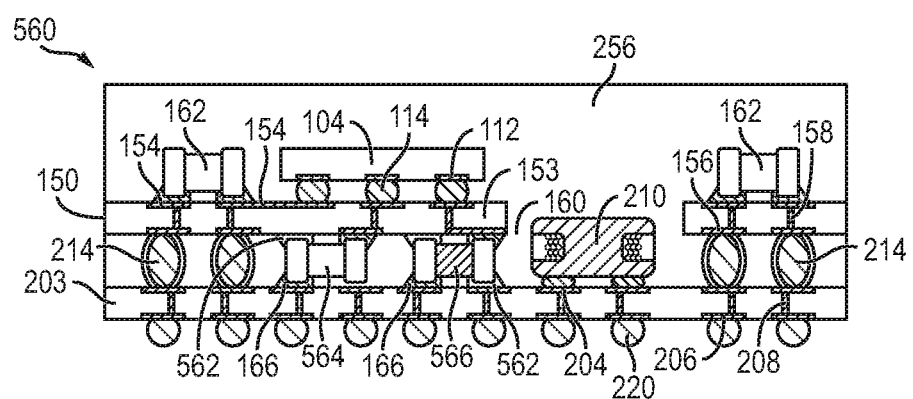

FIGS. 17a and 17b illustrate using horizontally oriented discrete devices 162 as vertical interconnects between substrates 150 and 200. SiP module 550 in FIG. 17a is manufactured similarly to the above SiP modules. However, the horizontally oriented discrete devices 552 and 554 are directly electrically coupled both to substrate 150 and substrate 200.

Discrete devices 552 and 554 are first disposed on one of substrate 150 or 200. The discrete devices can have either one or both terminals mechanically and electrically coupled to the first substrate 150 or 200 by solder paste 166. Solder paste 166 is also disposed on the second substrate 150 or 200 at locations where the second substrate is to be coupled to discrete devices 552 and 554. The upper SiP submodule is disposed over substrate 200, and solder paste 166 is reflowed to melt the solder between substrate 150, substrate 200, and discrete devices 552 and 554.

Discrete devices 552 and 554 can provide electrical connection between substrates 150 and 200 both through the discrete devices and also directly through terminals of the discrete devices. The left terminal of discrete device 552 is directly coupled to conductive layer 204 of substrate 200. The contact pad of conductive layer 204 coupled to the left terminal of discrete device 552 is coupled to a contact pad of substrate 150 through the discrete device. Conductive layer 204 has another contact pad directly coupled to the right terminal of discrete device 552, as does conductive layer 156 of substrate 150.

Conductive layer 156 of substrate 150 is directly coupled to one contact pad of substrate 200 through the right terminal of discrete device 552, and is coupled to a second contact pad of substrate 200 through the discrete device. On the other hand, discrete device 554 has one terminal only coupled to substrate 150 and a second terminal only coupled to substrate 200. Discrete device 554 couples the substrates together through the discrete device without providing an additional direct connection. Every terminal of a discrete device can be coupled to either of substrate 150 or substrate 200, or both.

Having only one terminal of a discrete device mechanically coupled by solder paste 166 is normally enough to support the discrete device cantilevered over the substrate during manufacturing. However, in embodiments where additional mechanical support is needed prior to having the second terminal coupled to the second substrate, or prior to encapsulant 256 being deposited, a non-conductive material or adhesive 562 can be used to mechanically support the discrete devices without providing electrical connection. Non-conductive material 562 can also enhance electrical isolation.

FIG. 17b illustrates SiP module 560. Adhesive 562 is initially used to mount discrete devices 564 and 566 to substrate 150 when forming the top SiP submodule. Even though the circuit design only calls for a single terminal of each of discrete devices 564 and 566 to be coupled to substrate 150, adhesive 562 adds strength to the mechanical connection and increases manufacturing yields. The connection to the second substrate, substrate 200 in this example, can include adhesive 562 on an unused second terminal of the discrete devices as illustrated with discrete device 566, or the second terminals can be left floating if unused as illustrated with discrete device 564.

Figure 18:
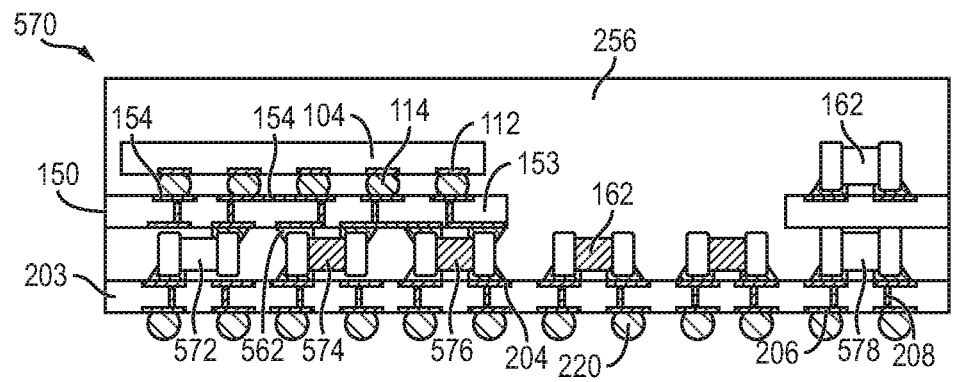
FIG. 18 illustrates a SiP module with discrete devices supporting an interposer substrate.

FIG. 18 illustrates discrete devices 572, 574, 576, and 578 supporting substrate 150 during the manufacturing process. Substrate 150 is disposed on substrate 200 with discrete devices 572-578 already mounted on one of the two substrates. Substrate 150 rests on discrete devices 572-578 or on solder paste disposed between the two. Solder paste 166 is reflowed to mechanically attach substrate 150 to substrate 200 through discrete devices 572-578.

If no electrical connection is required between substrate 150 and substrate 200 through any one of the discrete devices, substrate 150 can be allowed to rest on the discrete device without any solder paste and without conductive layer 156 having a contact pad over the terminal, as illustrated with discrete device 578. Additional vertical interconnect structures, such as CCSB 214, may or may not be needed depending on the requirements of the particular circuit being implemented.

Figure 19:
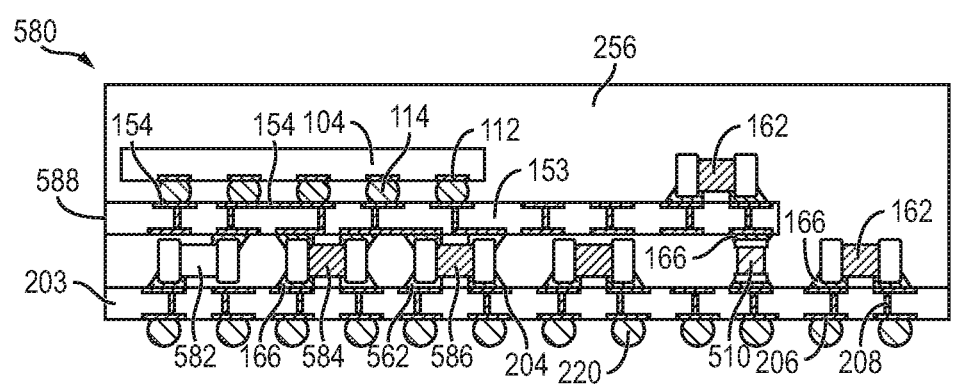
FIG. 19 illustrates another embodiment with discrete devices supporting an interposer substrate.

FIG. 19 illustrates SiP module 580 with discrete devices 582, 584, and 586 supporting substrate 588 over the bottom substrate during manufacture. A vertically oriented discrete device 510 also contributes to supporting substrate 588 over substrate 200. Substrate 588 is smaller than substrate 200 to allow room for taller components around the outside of the package rather than including an opening over taller components as with substrate 150. In other embodiments, any of the above or below disclosed SiP modules can be made with two substrates having essentially the same footprint without openings if all desired components fit vertically between the two substrates.

Figure 20:
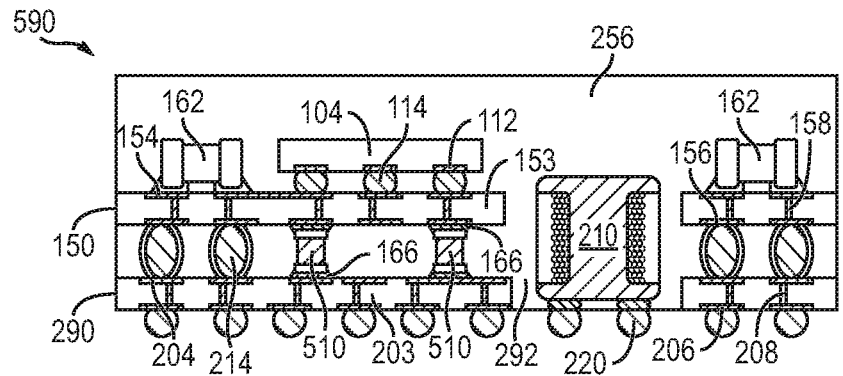
FIG. 20 illustrates a SiP module with an embedded inductor and vertical discrete devices.

FIG. 20 illustrates SiP module 590 with inductor 210 embedded within an opening of substrate 290, similar to FIG. 11c above. Vertical discrete devices 510 provide desired electrical functionality along with electrical interconnection between the two substrates.

Figure 21:
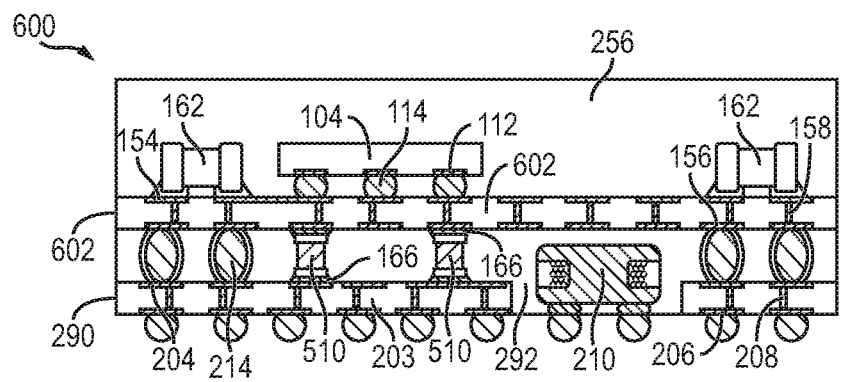
FIG. 21 illustrates a SiP module with an embedded inductor and an interposer substrate overlying the inductor.

FIG. 21 illustrates SiP module 600 with inductor 210 embedded in an opening of substrate 290 as in FIG. 20. However, inductor 210 is short enough that no opening in the top substrate 602 is required. Substrate 602 extends completely over inductor 210. Clearance is provided by an opening in the bottom substrate 290 rather than in the top substrate 602.

Figure 22:
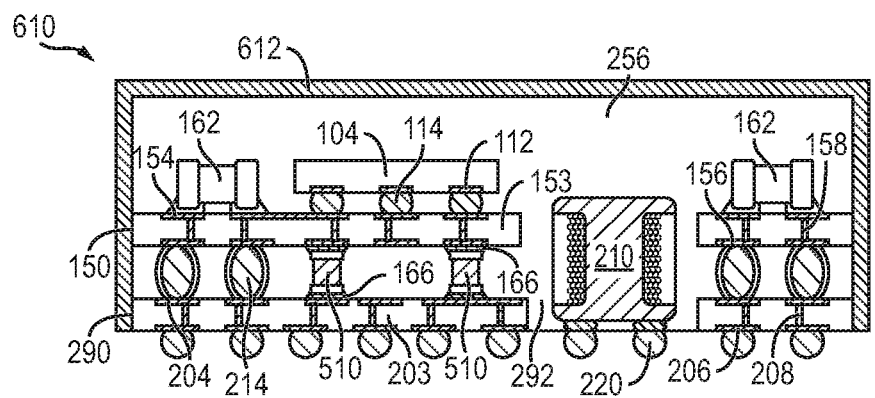
FIG. 22 illustrates an embodiment with a shielding layer.

FIG. 22 illustrates SiP module 610 with shielding layer 612 deposited over the SiP module. Any of the above embodiments can have a conductive layer sputtered over the package during manufacturing to provide an electromagnetic interference reducing capability. Shielding layer 612 can be electrically coupled to ground through any of the conductive layers of the substrates extending to the edge of the substrate. The sputtered metal of shielding layer 612 contacts any number of the exposed conductive layers at the edges of the substrates.

Any of the above SiP modules is mounted on a substrate and integrated into an electrical system as shown in FIGS. 15a and 15b. Having components electrically coupled vertically within the SiP module provides additional electrical paths through components that would be utilized anyway, without requiring additional vertical interconnect structures. The overall footprint of the devices is reduced by reducing the number of vertical interconnect structures required to be disposed side-by-side between substrates of the SiP modules. In addition, electrical performance is improved due to the shorter electrical paths. Electrical signals flow directly through a discrete device between the substrates, rather than having to flow through the discrete device and then over to a vertical interconnect structure.

The illustrated component layouts are not intended to be limiting. Any of the above SiP modules can be formed with additional passive components disposed on any of the substrates. Any of the above SiP modules can be formed with a semiconductor die on either of the substrates, or with no semiconductor die at all. Any potential combination of active and passive components is contemplated within the scope of the present disclosure.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a first substrate;
   providing a second substrate;
   forming an opening through the second substrate;
   disposing a first semiconductor component and second semiconductor component between the first substrate and second substrate, wherein the second substrate is electrically coupled to the first substrate through the first semiconductor component and the second semiconductor component extends into the opening, and wherein the first semiconductor component supports the first substrate over the second substrate; and
   depositing an encapsulant over the first substrate and second substrate.

2. The method of claim 1, further including:
   electrically coupling a first terminal of the first semiconductor component to the first substrate; and
   electrically coupling a second terminal of the first semiconductor component to the second substrate.

3. The method of claim 2, wherein the first terminal of the first semiconductor component is directly over the second terminal of the first semiconductor component.

4. The method of claim 2, further including disposing a non-conductive material between the first terminal and the second substrate or between the second terminal and the first substrate.

5. The method of claim 1, further including forming a shielding layer over the encapsulant.

6. A method of making a semiconductor device, comprising:
   providing a first substrate;

providing a second substrate;

disposing a semiconductor component between the first substrate and second substrate, wherein the second substrate is electrically coupled to the first substrate through the semiconductor component;

disposing a non-conductive material between a first terminal of the semiconductor component and the first substrate or second substrate; and depositing an encapsulant over the first substrate and second substrate.

7. The method of claim 6, further including:

electrically coupling the first terminal of the semiconductor component to the first substrate; and electrically coupling a second terminal of the semiconductor component to the second substrate.

8. The method of claim 6, further including disposing a semiconductor die over the second substrate.

9. The method of claim 6, wherein the first substrate and second substrate are electrically coupled to a common terminal of the semiconductor component.

10. The method of claim 6, further including forming a shielding layer over the encapsulant, wherein the shielding layer is electrically connected to the first substrate or second substrate.

11. The method of claim 6, further including:

forming an opening through the second substrate; and disposing a second semiconductor component between the first substrate and second substrate with the second semiconductor component extending into the opening.

12. The method of claim 6, further including disposing a second semiconductor component over the second substrate opposite the semiconductor component.

13. A method of making a semiconductor device, comprising:

providing a first substrate;

providing a second substrate;

forming an opening through the second substrate;

disposing a first semiconductor component between the first substrate and second substrate, wherein the second substrate is electrically coupled to the first substrate through the first semiconductor component, and wherein a first terminal of the first semiconductor component is directly over a second terminal of the first semiconductor component; and disposing a second semiconductor component between the first substrate and second substrate with the second semiconductor component extending into the opening.

14. The method of claim 13, further including disposing a third semiconductor component over the second substrate opposite the first semiconductor component.

15. The method of claim 14, wherein the third semiconductor component is electrically connected to the first semiconductor component through the second substrate.

16. The method of claim 13, further including depositing an encapsulant over the first substrate, second substrate, first semiconductor component, and second semiconductor component.

17. The method of claim 16, further including forming a shielding layer over the encapsulant.

18. A semiconductor device, comprising:

a first substrate;

a second substrate;

a semiconductor component electrically coupled between the first substrate and second substrate with a first terminal of the semiconductor component directly over a second terminal of the semiconductor component;

an encapsulant deposited over the first substrate, second substrate, and semiconductor component; and a shielding layer formed over the encapsulant.

19. The semiconductor device of claim 18, wherein the semiconductor component is oriented vertically between the first substrate and second substrate.

20. The semiconductor device of claim 18, wherein the shielding layer physically contacts the first substrate or second substrate.

21. The semiconductor device of claim 18, further including:

an opening formed through the second substrate; and a second semiconductor component disposed between the first substrate and second substrate with the second semiconductor component extending into the opening.

* * * * *